(12) United States Patent
Kawashima

(10) Patent No.: US 7,547,502 B2
(45) Date of Patent: Jun. 16, 2009

(54) EXPOSURE METHOD

(75) Inventor: Miyoko Kawashima, Haga-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 430 days.

(21) Appl. No.: 11/552,295

(22) Filed: Oct. 24, 2006

(65) Prior Publication Data
US 2007/0092841 A1   Apr. 26, 2007

(30) Foreign Application Priority Data
Oct. 25, 2005   (JP) ............................. 2005-309799

(51) Int. Cl.
*G03F 7/20*   (2006.01)
(52) U.S. Cl. .............................. 430/311; 430/5; 430/22; 430/322
(58) Field of Classification Search ...................... 430/5, 430/22, 311, 322
See application file for complete search history.

(56) References Cited

U.S. PATENT DOCUMENTS

2002/0031725 A1   3/2002   Sugita et al.
2003/0198872 A1   10/2003   Yamazoe et al.
2004/0166422 A1   8/2004   Yamazoe et al.

FOREIGN PATENT DOCUMENTS

| JP | 2000-40656 | 2/2000 |
| JP | 2003-203850 | 7/2003 |
| JP | 2003-233165 | 8/2003 |
| JP | 2003-318100 | 11/2003 |
| JP | 2004-272228 | 9/2004 |

OTHER PUBLICATIONS

Hochul Kim et al., "Layer Specific Illumination Optimization by Monte Carlo Method", Optical Microlithography XVI, Anthony Yen, Editor, Proceedings of SPIE, 2003, pp. 244-250, vol. 5040.

*Primary Examiner*—Mark F Huff
*Assistant Examiner*—Caleen O Sullivan
(74) *Attorney, Agent, or Firm*—Locke, Lord, Bissell & Liddell, LLP

(57) ABSTRACT

An exposure method includes the step of illuminating a mask having a contact hole pattern that includes a hybrid pattern using an illumination light that forms an effective source that has plural poles, and projecting an image of the mask onto a plate through a projection optics. The hybrid pattern includes a matrix pattern in which plural contact holes are arranged in a matrix shape, and a checker pattern in which plural contact holes are arranged in a checker shape. Three or four diffracted lights from the contact hole pattern interfere with each other.

11 Claims, 27 Drawing Sheets

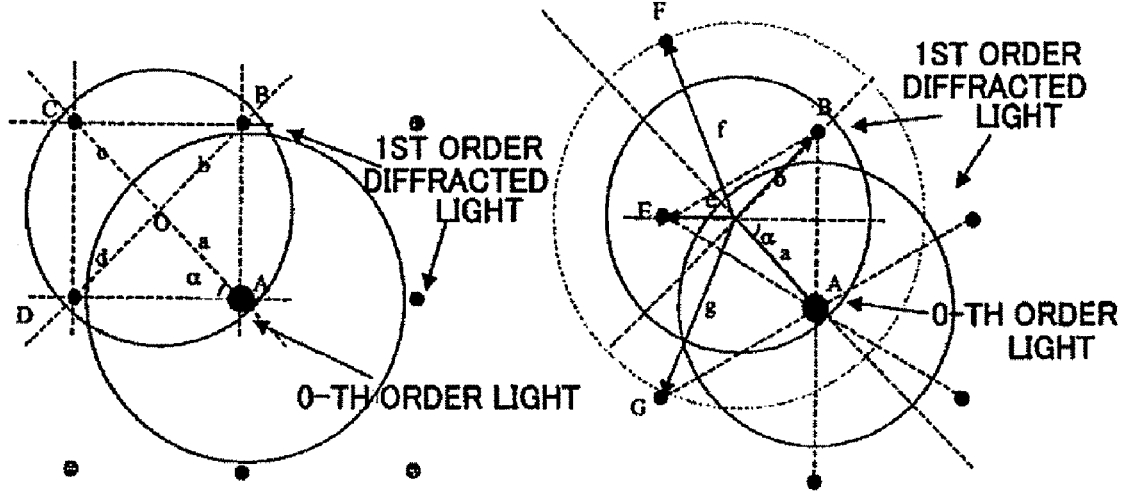
FIG. 8A　　　　FIG. 8B
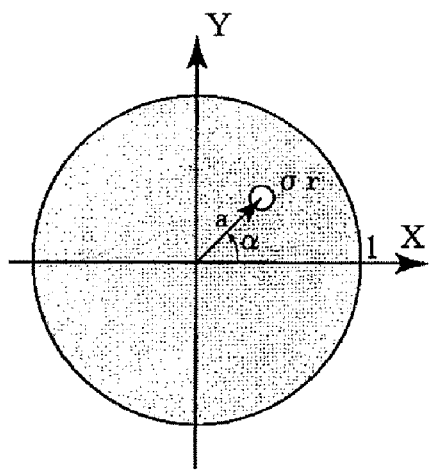　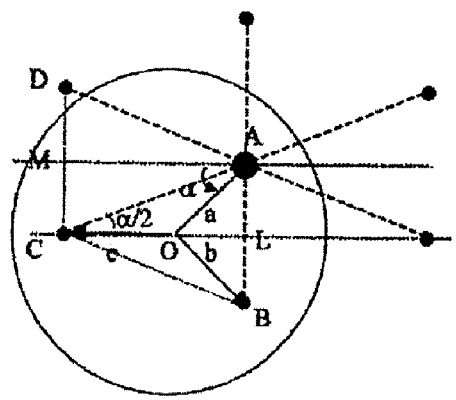
FIG. 9A　　　　FIG. 9B

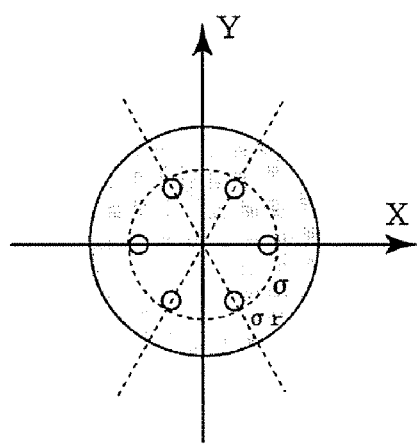 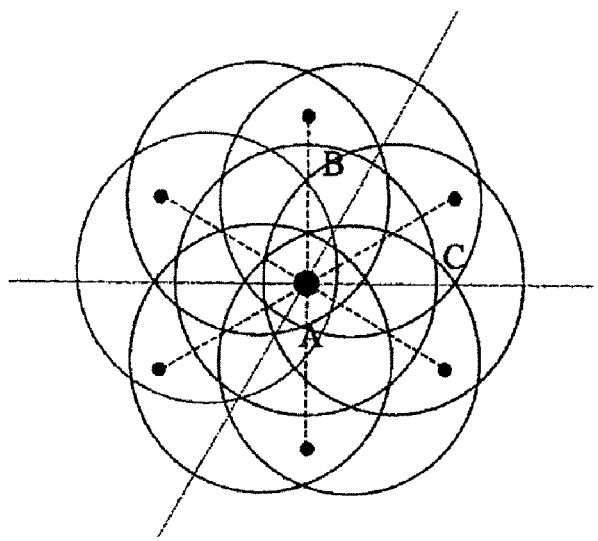
FIG. 13A  FIG. 13B
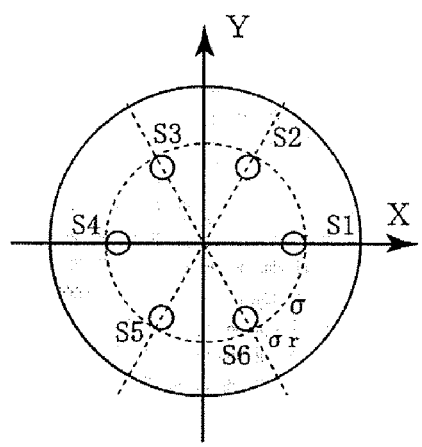 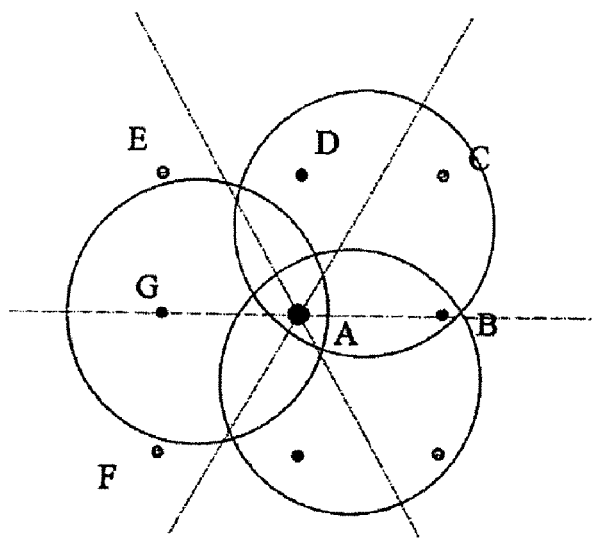
FIG. 14A  FIG. 14B

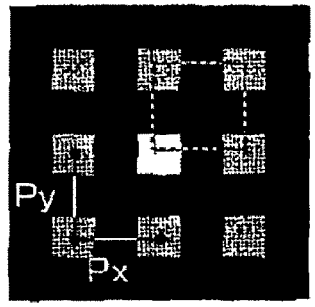
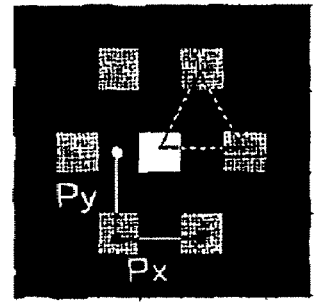
FIG. 22A  FIG. 22B
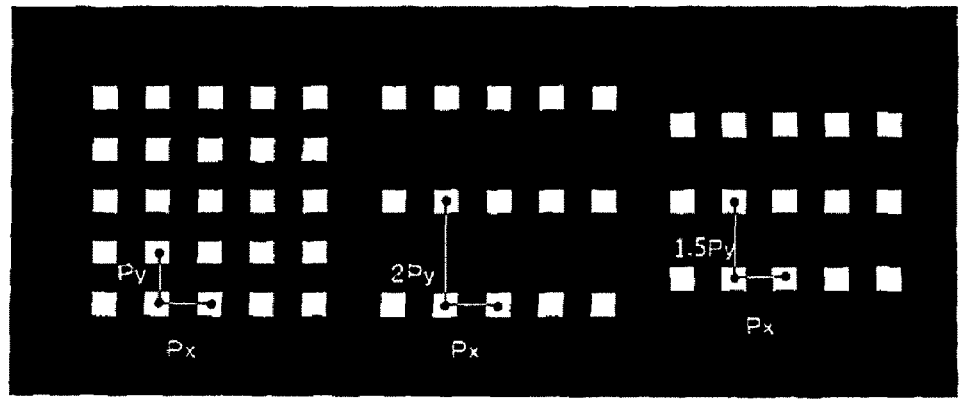
FIG. 23A   FIG. 23B   FIG. 23C

EXPOSURE METHOD

BACKGROUND OF THE INVENTION

The present invention relates generally to exposure, and more particularly to an exposure method used to manufacture various devices including a semiconductor chip, a display device, a sensing device, an image pickup device, and a fine contact hole pattern for use with the micromechanics. The micromechanics applies the semiconductor IC fabrication technologies for manufactures of a fine structure, and means a sophisticated mechanical system that may operate at a micron level or the technologies for manufacturing the mechanical system.

A conventional projection exposure apparatus projects a mask (or reticle) pattern onto a wafer via a projection optics, and transfers the circuit pattern using the photolithography technology. The mask pattern can contain contact holes. Along the recent demands for fine processing to devices, the projection optics have been increasingly demanded to stably image fine contact holes. For the high-resolution pattern transfer, an optimal exposure condition, such as a mask type and an illumination condition, should be set in accordance with the pattern type. A large depth of focus ("DOF") is necessary for a stable imaging characteristic, and the illumination condition also affects the DOF.

There are several types of contact hole patterns, such as a close and periodic contact hole array, a separated and isolated contact hole, and another isolated pattern. The contact hole array includes a matrix type in which square holes are arranged in a matrix shape, and a checker type in which respective adjacent arrays shift to each other. An actual circuit pattern mixes a matrix pattern and a checker pattern, and is referred to as a "hybrid pattern" hereinafter. There are proposed various illumination conditions suitable for the matrix pattern and the hybrid pattern. For example, an annular illumination is suitable for the hybrid pattern. In addition, a rectangular contact hole is also known. See, for example, Hochul Kim et al., "Layser Specific Illumination Optimization by Monte Carlo Method," Optical Microlithography XVL, Anthony Yen, Editor, Proceedings of SPIE, Vol. 5040 (2003), pp. 244-250.

A known mask type covers a binary mask, a phase shift mask ("PSM"), and an attenuated-PSM. The illumination condition covers a polarization condition, and it is known that a tangential polarization is suitable for a two-beam interference, and a radial polarization is suitable for a four-beam interference. Polarization control will become important, as in an immersion exposure apparatus, etc., as a high NA scheme advances in the near future.

Other prior art include Japanese Patent Applications, Publication Nos. 2000-040656, 2003-203850, 2004-272228, 2003-318100, and 2003-233165.

A projection exposure apparatus has a resolution R optical system given by Rayleigh's formula where $\lambda$ is a wavelength of a light source, and NA is a numerical aperture of a projection optics:

$$R = k_1 (\lambda/NA) \quad \text{[EQUATION 1]}$$

Here, $k_1$, is a constant determined by a development process, and about 0.5 to 0.7 for the normal exposure. The recent high integration of a device increasingly craves a finer transferred pattern or a higher resolution. From the above equation, a higher NA and a smaller wavelength $\lambda$ are effective to the high resolution. Nevertheless, these improvements appear to reach the limits at present, and the normal exposure has difficulties in forming a contact hole pattern with 0.1 μm or smaller on a wafer.

In particular, it is difficult to image, with a sufficient DOF, a contact hole array that mixes a matrix pattern and a checker pattern. In addition, an optimal exposure condition to the checker pattern is not fully analyzed. There are demands to make the resolving characteristic better than the conventional annular illumination with a sufficient DOF for actually frequently used hybrid patterns.

BRIEF SUMMARY OF THE INVENTION

The present invention is directed to an exposure method, which provides an illumination condition that improves an imaging characteristic for a hybrid pattern with a sufficient DOF.

An exposure method according to one aspect of the present invention includes the step of illuminating a mask having a contact hole pattern that includes a hybrid pattern using an illumination light that forms an effective source that has plural poles, and projecting an image of the mask onto a plate through a projection optics, the hybrid pattern including a matrix pattern in which plural contact holes are arranged in a matrix shape, and a checker pattern in which plural contact holes are arranged in a checker shape, wherein the matrix pattern has $n_i$ pitches, in which $Px_i$ is an i-th pitch between contact holes in a array direction, and $Py_i$ is an i-th pitch between contact holes in a column direction, the checker pattern has $n_j$ pitches, in which $Px_j$ is a j-th pitch between contact holes in a array direction, and $Py_j$ is a j-th pitch between contact holes in a column direction, NA is a numerical aperture of the projection optics, and $\lambda$ is a wavelength of the illumination light, wherein the following equations are satisfied $Pxo_i/2=(Px_i/2)NA/\lambda$, $1 \leq i \leq n_i$, $Pyo_i/2=(Py_i/2)NA/\lambda$, $1 \leq i \leq n_i$, $Pxo_j/2=(Px_j/2)NA/\lambda$, $1 \leq j \leq n_j$, $Pyo_j/2=(Py_j/2)NA/\lambda$, $1 \leq j \leq n_j$, $\alpha_i = \tan^{-1}(Pxo_i/Pyo_i)$, $1 \leq i \leq n_i$, $\alpha_j = 2\tan^{-1}(Pxo_j/(2Pyo_j))$, $1 \leq j \leq n_j$, $a_i = 1/(4(Pyo_i/2))/\sin(\alpha_i)$, $1 \leq i \leq n_i$, $a_j = 1/(4(Pyo_j/2))/\sin(\alpha_j)$, $1 \leq j \leq n_j$, and wherein a distance between each centroid of the plural poles in the effective source and a center of the pupil in the projection optics is the same as $a_i$, the centroid of the plural poles being located at angles $\alpha_i$, $\pi-\alpha_i$, $\pi+\alpha_i$, and $2\pi-\alpha_i$ where $\alpha_i$ is an angle from the array direction viewed from the center of the pupil, a distance between each centroid of the plural poles in the effective source and a center of the pupil in the projection optics being the same as $a_j$, the centroid of the plural poles being located at angles $\alpha_j$, $\pi-\alpha_j$, $\pi+\alpha_j$, and $2\pi-\alpha_j$ where $\alpha_j$ is an angle from the column direction viewed from the center of the pupil, and three or four diffracted lights from the contact hole pattern interfering with each other.

An exposure method according to another aspect of the present invention includes the step of illuminating a mask having a contact hole pattern that includes a hybrid pattern using an illumination light that forms an effective source that has four poles, and projecting an image of the mask onto a plate through a projection optics, the hybrid pattern including a matrix pattern in which plural contact holes are arranged in a matrix shape, and a checker pattern in which plural contact holes are arranged in a checker shape, wherein a distance between each centroid of the four poles in the effective source and a center of the pupil in the projection optics is the same as a, the centroids of the four poles being located at angles $\alpha$, $\pi-\alpha$, $\pi+\alpha$, and $2\pi-\alpha$ where a is an angle from a array direction viewed from the center of the pupil, the matrix pattern having a pitch $Px_1$ between contact holes in a array direction, and a pitch $Py_1$ between the contact holes in a column direction, the checker pattern having a pitch $Px_2$ between contact holes in a array direction, and a pitch $Py_2$ between the contact holes in a column direction, NA being a numerical aperture of the projection optics, and $\lambda$ being a wavelength of the illumination light, and wherein the following equations are satisfied $Pxo_1/2=(Px_1/2)NA/\lambda$, $Pyo_1/2=(Py_1/2)NA/\lambda$, $Pxo_2/2=(Px_2/2)NA/\lambda$, $Pyo_2/2=(Py_2/2)NA/\lambda$, $\alpha_1=\tan^{-1}(Pxo_1/Pyo_1)$, $\alpha_2=2\tan^{-1}(Pxo_2/(2Pyo_2))$, $a_1=1/(4(Pyo_1/2))/\sin(\alpha_1)$, $a_2=1/(4(Pyo_2/2))/\sin(\alpha_2)$, $\alpha$ contains $\alpha_1$ and $\alpha_2$, a contains $a_1$ and $a_2$, and three or four diffracted lights from the contact hole pattern interfering with each other.

An exposure method according to another aspect of the present invention includes the step of illuminating a mask having a contact hole pattern that includes a hybrid pattern using an illumination light that forms an effective source that has eight poles, and projecting an image of the mask onto a plate through a projection optics, the hybrid pattern including a matrix pattern in which plural contact holes are arranged in a matrix shape, and a checker pattern in which plural contact holes are arranged in a checker shape, wherein a distance between each centroid of the eight poles in the effective source and a center of the pupil in the projection opticsis the same as $a_1$, the centroids of the plural poles being located at angles $\alpha_1$, $\pi-\alpha_1$, $\pi+\alpha_1$, and $2\pi-\alpha_1$ where $a_1$ is an angle from a array direction viewed from the center of the pupil, and is the same as $a_2$, the centroids of the eight poles being located at angles $\alpha_2$, $\pi-\alpha_2$, $\pi+\alpha_2$, and $2\pi-\alpha_2$ where $\alpha_2$ is an angle from a column direction viewed from the center of the pupil, the matrix pattern having a pitch $Px_1$ between contact holes in a array direction, and a pitch $Py_1$ between the contact holes in a column direction, the checker pattern having a pitch $Px_2$ between contact holes in a array direction, and a pitch $Py_2$ is between the contact holes in a column direction, NA being a numerical aperture of the projection optics, and $\lambda$ being a wavelength of the illumination light, wherein the following equations are satisfied $Pxo_1/2=(Px_1/2)NA/\lambda$, $Pyo_1/2=(Py_1/2)NA/\lambda$, $Pxo_2/2=(Px_2/2)NA/\lambda$, $Pyo_2/2=(Py_2/2)NA/\lambda$, $\alpha_1=\tan^{-1}(Pxo_1/Pyo_1)$, $\alpha_2=2\tan^{-1}(Pxo_2/(2Pyo_2))$, $a_1=1/(4(Pyo_1/2))/\sin(\alpha_1)$, $a_2=1/(4(Pyo_2/2))/\sin(\alpha_2)$, and three or four diffracted lights from the contact hole pattern interfering with each other.

Other objects and further features of the present invention will become readily apparent from the following description of the preferred embodiments with reference to accompanying drawings.

BRIEF DESCRIPTION OF THE DRAWINGS

FIG. 8A is a schematic plane view showing a relationship between the pupil and diffracted lights for the four-beam interference of the left pattern shown in FIG. 5A.

FIG. 8B is a schematic plane view showing a relationship between the pupil and diffracted lights for the three-beam interference of the right pattern shown in FIG. 5A.

FIG. 9A is a plane view of an effective source.

FIG. 9B is a schematic plane view showing a relationship between the pupil and diffracted lights from the effective source shown in FIG. 9A.

FIG. 13A is a plane view of an effective source shape of a hexapole illumination suitable for the resolution of the checker contact hole pattern.

FIG. 13B is a schematic plane view showing a relationship between the diffracted lights and the pupil when the effective source shown in FIG. 13A illuminates the right pattern shown in FIG. 5A.

FIG. 14A is a plane view of an effective source shape of a hexapole illumination.

FIG. 14B is a schematic plane view showing a relationship between the pupil and diffracted lights when the effective source shown in FIG. 14A illuminates the left pattern shown in FIG. 5A.

FIG. 22A is a plane view for explaining a method of inserting an auxiliary pattern in a matrix shape.

FIG. 22B is a plane view for explaining a method of inserting an auxiliary pattern in a checker shape.

FIGS. 23A to 23C are plane views of matrix contact hole patterns.

DETAILED DESCRIPTION OF THE PREFERRED EMBODIMENTS

Figure 1:
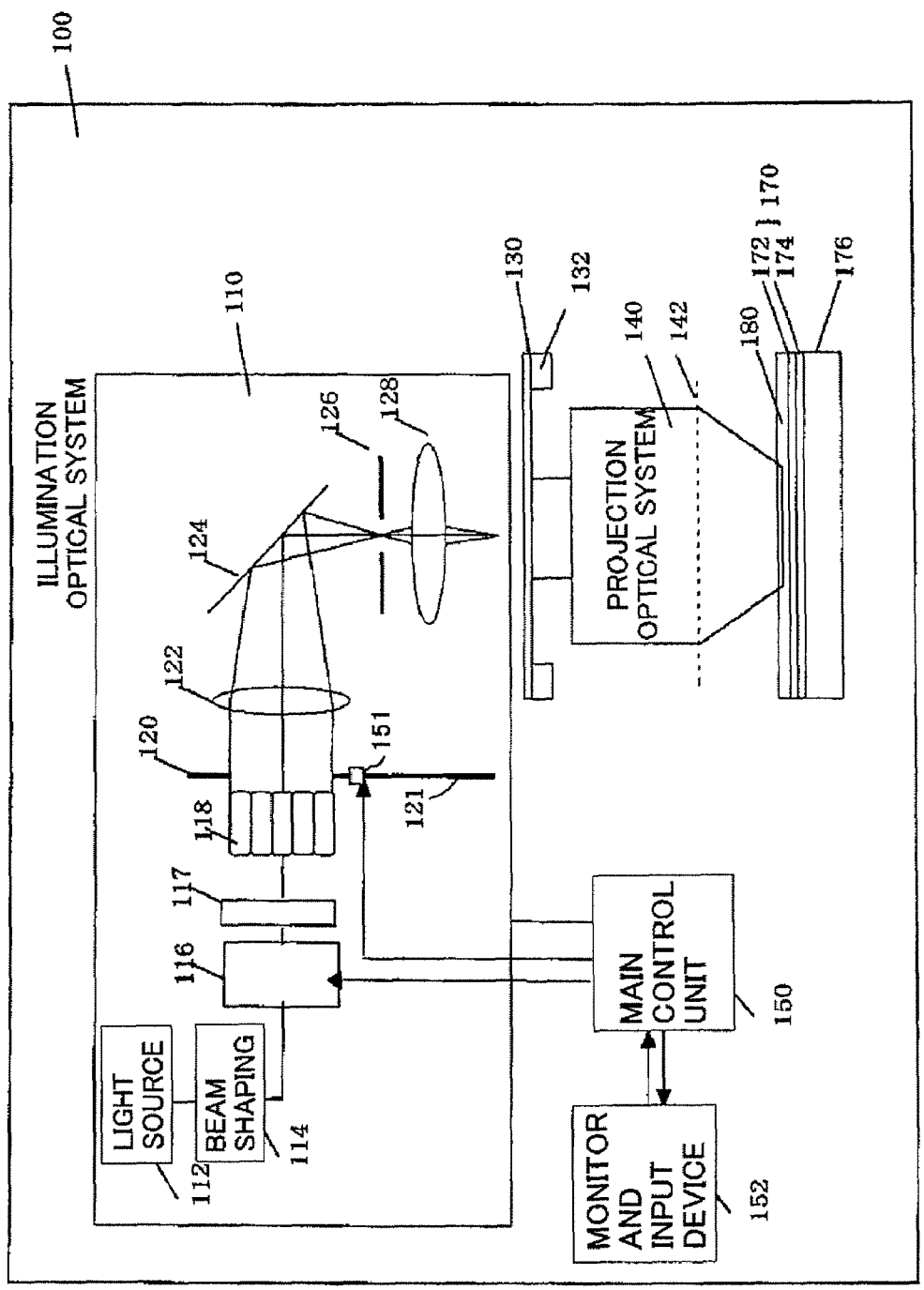
FIG. 1 is a schematic block diagram of an exposure apparatus according to one embodiment of the present invention.

Referring now to the accompanying drawings, a description will be given of an illustrative exposure apparatus 100. Here, FIG. 1 is a schematic block diagram of the exposure apparatus 100. The exposure apparatus 100 includes, as shown in FIG. 1, an illumination apparatus 110, a mask (reticle) 130, a projection optics 140, a main control unit 150, a wafer 170, and a liquid 180 as a medium.

Thus, the exposure apparatus 100 is an immersion type exposure apparatus that partially or entirely immerses, in the liquid 180, the space between the wafer 170 and the final surface of the projection optics 140 closest to the wafer 170, and exposes patterns of the mask 130 onto the wafer 170 via the liquid 180. Although the exposure apparatus 100 of the instant embodiment is a step-and-scan manner projection exposure apparatus, the present invention is applicable to a step-and-repeat manner and other exposure methods.

The illumination apparatus 110 illuminates the mask 130 having a circuit pattern to be transferred, and includes a light source section and an illumination optical system.

The light source section includes a laser 112 as a light source, and a beam shaping system 114. The laser 112 may be pulsed laser such as an ArF excimer laser with a wavelength of approximately 193 nm, a KrF excimer laser with a wavelength of approximately 248 nm, and an $F_2$ laser with a wavelength of approximately 157 nm. A kind of laser, the number of laser units, and a type of light source section are not limited. The usable light source is not limited to the laser 112, and may use one or more lamps, such as a mercury lamp and a xenon lamp.

The beam shaping system 114 can use, for example, a beam expander, etc., with a plurality of cylindrical lenses, and converts an aspect ratio of the size of the sectional shape of a parallel beam from the laser 112 into a desired value, thus reshaping the beam shape to a desired one. The beam shaping system 114 forms a beam that has a size and divergent angle necessary for illuminating an optical integrator 118 described later.

The illumination optical system is an optical system that illuminates the mask 130, and includes a condenser optical system 116, a polarization controller 117, an optical integrator 118, an aperture stop 120, a condenser lens 122, a deflecting mirror 124, a masking blade 126, and an imaging lens 128 in this embodiment. The illumination optical system 120 can provide various illumination modes, such as a conventional illumination, an annular illumination, and a quadrupole illumination, in addition to a hexapole illumination.

The condenser optical system 116 includes plural optical elements, and efficiently introduces a beam with the desired shape to the optical integrator 118. For example, the condenser optical system 116 involves a zoom lens system to control the shape and angular distribution of the incident beam to the optical integrator 118.

The condenser optical system 116 further includes an exposure dose regulator that can change an exposure dose of the illumination light for the mask 130 per illumination. The exposure dose regulator is controlled by the main control unit 150. An exposure dose monitor is provided, for example, between the optical integrator 118 and the reticle 130, or at another location, to measure the exposure dose and to feed back the result.

The polarization controller 117 includes, for example, a polarization element arranged at an approximately conjugate with a pupil 142 in the projection optics 140. The polarization controller 117 controls or converts, as described later, a polarization state in a predetermined region of an effective source formed on the pupil 142. The polarization controller 117 can include plural types of polarization elements that are provided on a turret rotatable by an actuator (not shown), and the main control unit 150 controls driving of the actuator.

The optical integrator 118 makes uniform the illumination light that illuminates the mask 130, includes as a fly-eye lens in this embodiment, and converts an angular distribution of the incident light into a positional distribution, thus exiting the light. The fly-eye lens is configured so that its incident plane and its exit plane are in the Fourier transformation relationship, and includes a multiplicity of rod lenses (or fine lens elements). However, the optical integrator 118 usable for the present invention is not limited to the fly-eye lens, and may use an optical rod, a diffraction grating, two pairs of cylindrical lens array plates that are arranged so that these pairs are orthogonal to each other, etc.

Provided right after the exit plane of the optical integrator 118 is the aperture stop 120 that has a fixed shape and diameter. The aperture stop 120 is arranged at a position approximately conjugate with the effective source on the pupil 142 of the projection optics 140, and the aperture shape of the aperture stop 120 corresponds to the effective source shape on the pupil 142 plane in the projection optics 140. The effective source shape of this embodiment preferably is quadrupole or octapole, as described later.

As described later, various aperture stops can be switched so that it is located on the optical path by a stop exchange mechanism (or actuator) 121 according to illumination conditions. A drive control unit 151 controlled by the main control unit 150 controls driving of the actuator 121. The aperture stop 120 may be integrated with the polarization controller 117.

Figure 2A:
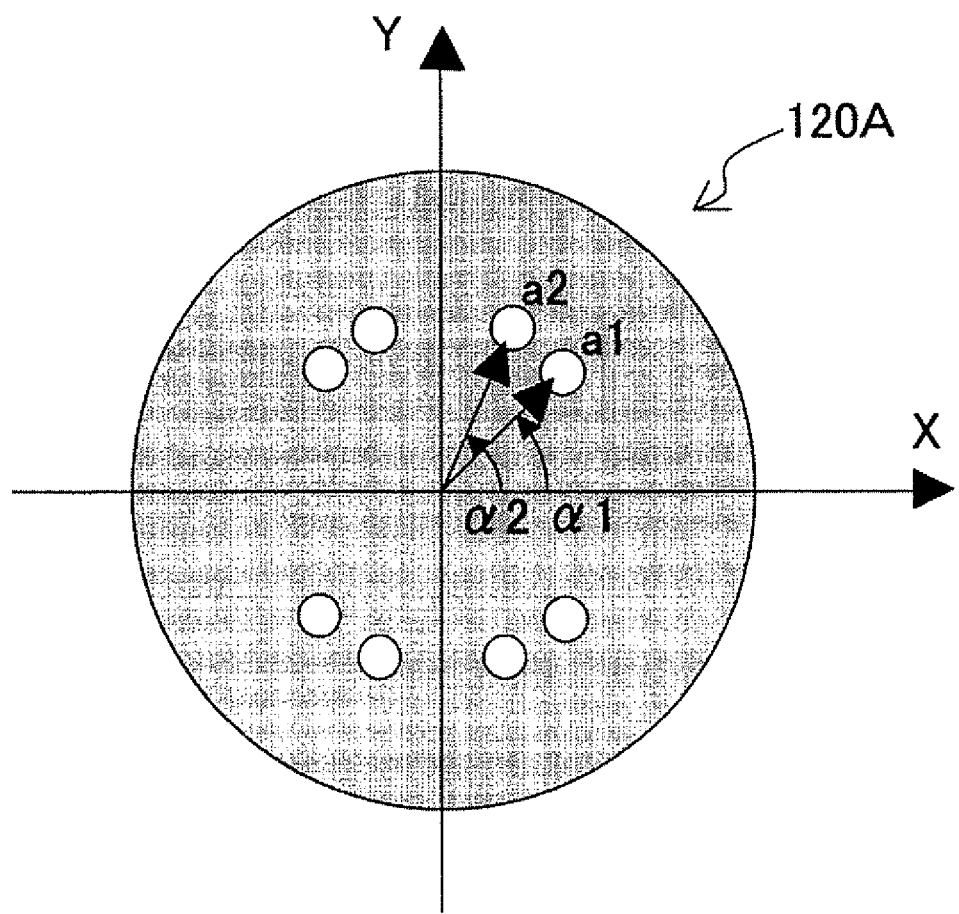
FIG. 2A is a schematic plane view of one shape applicable to an aperture stop in the exposure apparatus shown in FIG. 1.
Figure 3:
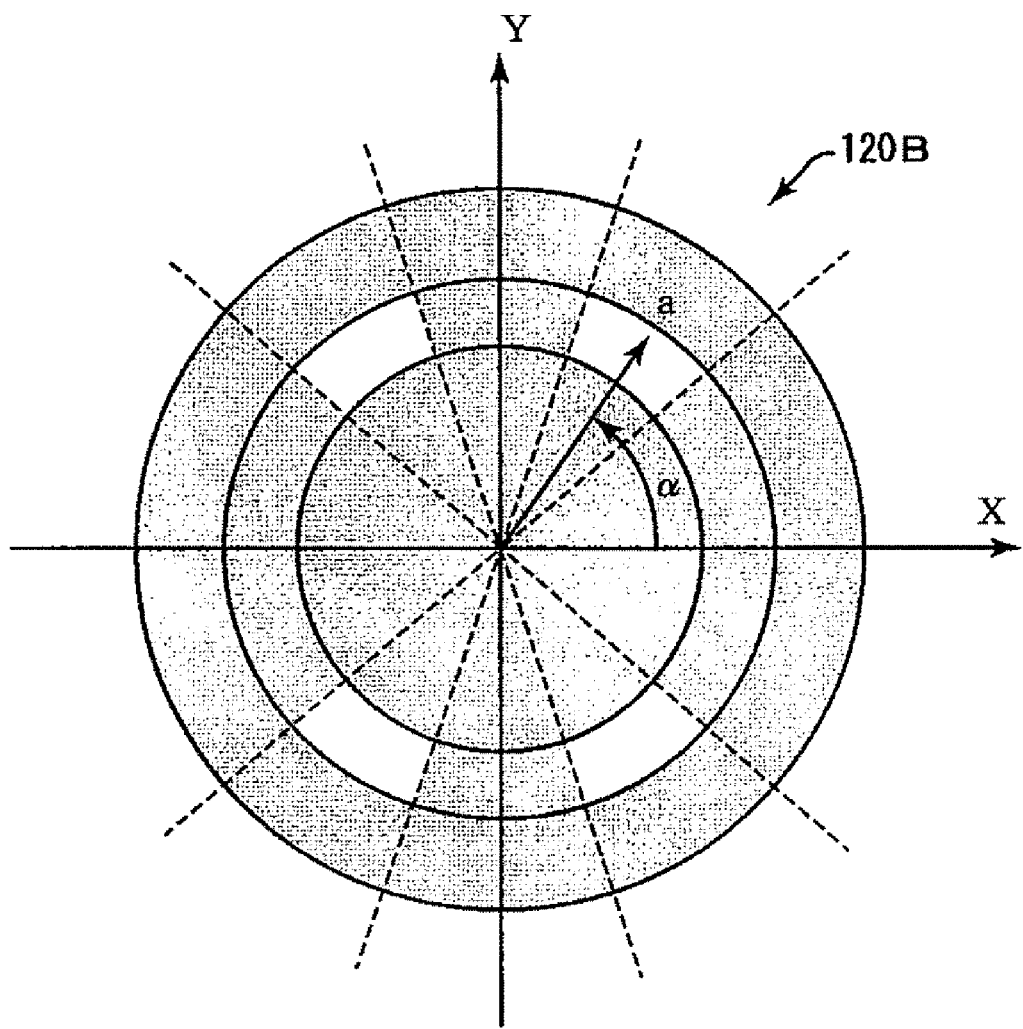
FIG. 3 is a schematic plane view of another shape applicable to the aperture stop in the exposure apparatus shown in FIG. 1.

FIG. 2A is a schematic plane view of an aperture stop 120A formed as a stop used for the octapole illumination. The aperture stop 120A has eight circular openings that have 0.2 or smaller are arranged at angle $\alpha 1$, $\pi-\alpha 1$, $\pi+\alpha 1$, and $2\pi-\alpha 1$ at radius a1, and at angle $\alpha 2$, $\pi-\alpha 2$, $\pi+\alpha 2$, and $2\pi-\alpha 2$ at radius a2. The σ conversion is a value normalized by a radius of the pupil in the projection optics. The aperture stop 120A has light transmitting part (white part) having a transmittance of 1 made of four circles, and a light shielding part (gray part) having a transmittance of 0. FIG. 3 is a schematic plane view of an aperture stop 120B formed as a stop used for the quadrupole illumination. Thus, each pole's shape may be an arc in the quadrupole illumination, and is not limited. However, centroid positions of the four poles are preferably those positions which are symmetrical to the optical axis of the projection optics 140 or X-axis and Y-axis.

The condenser lens 122 collects all the beams that have exited from a secondary light source near the exit plane of the optical integrator 118 and passed through the aperture stop 120. The beams are reflected by the mirror 124, and uniformly illuminate or Koehler-illuminate the masking blade 126.

The masking blade 126 includes plural movable light shielding plates, and has an arbitrary, approximately rectangular opening corresponding to the effective area of the projection optics 140. The light that has passed through the opening of the masking blade 126 is used as the illumination light for the mask. The masking blade 126 is a stop having an automatically variable opening width, thus making a transfer area changeable. The exposure apparatus 100 may further include a scan blade, with a structure similar to the above masking blade 126, which makes the transfer area changeable in the scanning direction. The scan blade is also a stop having an automatically variable opening width, and is placed at an optically approximately conjugate position to the mask 130 plane. Thus, the exposure apparatus can use these two variable blades to set the dimensions of the transfer area in accordance with the dimensions of an exposure shot.

The imaging lens 128 images an opening shape of the masking blade 126 onto the reticle 130.

Figure 5A:
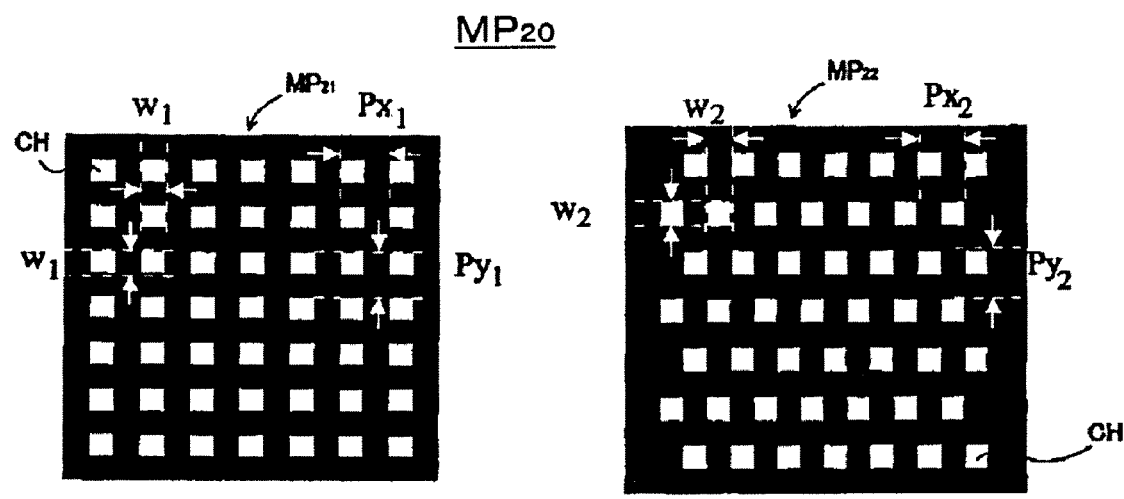
FIG. 5A is a plane view of one illustrative mask pattern shown in FIG. 1 using the basic pattern shown in FIG. 4.

The mask 130 has a pattern to be transferred, and is supported and driven by a mask stage 132. FIG. 5A shows an illustrative mask pattern $MP_{20}$. FIG. 5A is a plane view of the illustrative mask pattern $MP_{20}$. While the basic structure of the mask pattern $MP_{20}$ will be described later, the mask pattern $MP_{20}$ is a hybrid pattern of a matrix pattern $MP_{21}$ and a checker pattern $MP_{22}$. The diffracted lights emitted from the mask 130 pass the projection optics 140, and then are projected onto the wafer 170. The wafer 170 is a plate to be exposed, and a photoresist 172 is coated on a substrate 174. The mask 130 and the wafer 170 are located in an optically conjugate relationship. The exposure apparatus 100 in this embodiment is a step-and-scan type exposure apparatus (i.e., "scanner"), and therefore, scans the mask 130 and the wafer 170 to transfer a pattern on the mask 130 onto the wafer 170. When it is a step-and-repeat type exposure apparatus (i.e., "stepper"), the mask 130 and the wafer 170 are kept stationary for exposure.

The mask stage 132 supports the mask 130. The exposure apparatus 100 scans the mask 130 and the wafer 170 in a state synchronized with the main control unit 150.

The projection optics 140 serves to image the diffracted lights from the mask pattern MP onto the wafer 170. The projection optics 140 may use a dioptric optical system solely composed of a plurality of lens elements, a catadioptric optical system comprised of a plurality of lens elements and at least one concave mirror, and so on.

The main control unit 150 controls driving of each component, and particularly controls illuminations based on information input into the input device of the monitor and input device 152, information from the illumination apparatus 110, and a program stored in a memory (not shown). More specifically, the main control unit 150 controls, as described later, a shape of the effective source and the polarization state on the pupil 142 in the projection optics 140. Control information and other information for the main control unit 150 are indicated on the display of the monitor and input device 152.

The wafer 170 is replaced with a liquid crystal plate and another object to be exposed in another embodiment. The photoresist 172 is coated on the substrate 174.

The wafer 170 is supported by a wafer stage 176. The mask 130 and wafer 170 are, for example, scanned synchronously, and the positions of the mask stage 132 and wafer stage 176 are monitored, for example, by a laser interferometer and the like, so that both are driven at a constant speed ratio.

The final surface of the projection optics 140 closest to the wafer 170 is immersed in the liquid 180. The liquid 180 selects its material that has good transmittance to the wavelength of the exposure light, does not contaminate the projection optics 140, and matches the resist process. Coating on the final surface of the projection optics 140 protects the final surface from the liquid 180.

Figure 4:
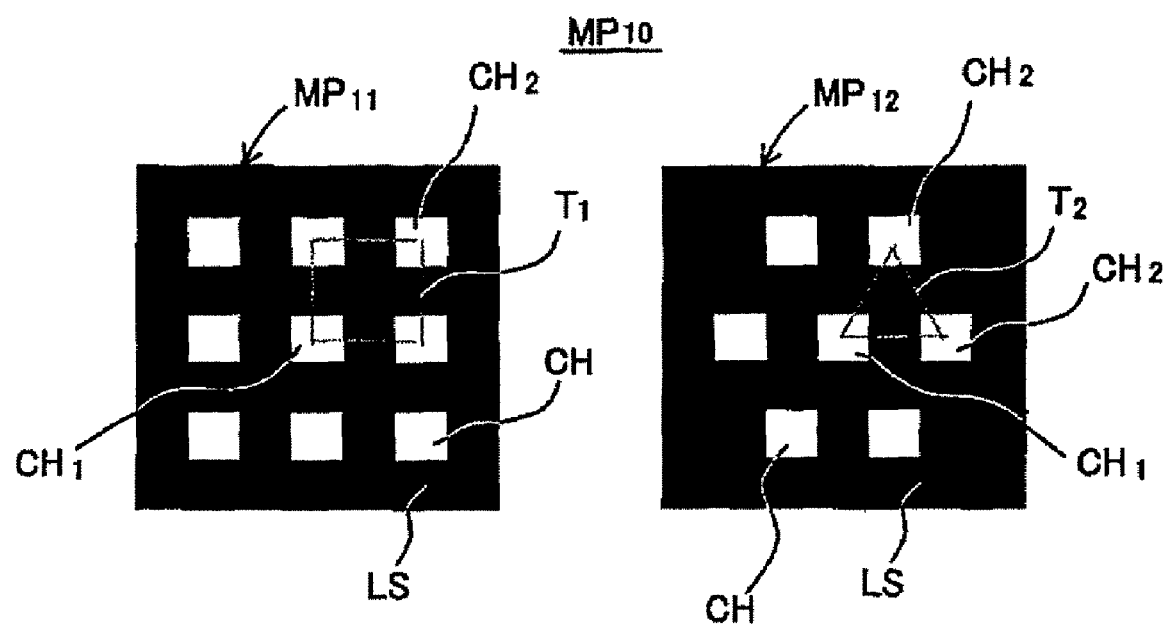
FIG. 4 is a schematic plane view of a basic structure of a mask pattern shown in FIG. 1.

Referring now to FIG. 4, a description will be given of a basic pattern $MP_{10}$ as a basic structure of the mask pattern $MP_{20}$. Here, FIG. 4 is a plane view of the mask pattern $MP_{10}$. As illustrated, the mask pattern $MP_{10}$ is a hybrid pattern that includes a matrix pattern $MP_{11}$, and a checker pattern $MP_{12}$. The matrix pattern $MP_{11}$, is a pattern in which plural contact holes CH are arranged in a matrix shape, and the checker pattern $MP_{12}$ is a pattern having plural contact holes CH in which each array of periodic pattern shifts by a half pitch between two adjacent arrays. More specifically, the matrix pattern $MP_{11}$, is a set of rectangular patterns $T_1$ arranged at eight holes $CH_2$ around one contact hole $CH_1$. The checker $MP_{12}$ is a set of triangular patterns $T_2$ arranged at six contact holes $CH_2$ around one contact hole $CH_1$. The contact holes $CH_1$ and $CH_2$ are the same contact holes and are named generically by the contact hole CH. FIG. 4 shows a binary mask. In the mask pattern $MP_{10}$, the contact hole CH denotes a light transmitting part, and LS denotes a light shielding part. The mask 130 may be an attenuated-PSM, in which the hole part is a light transmitting part having a transmittance of 1, and an attenuated-light shielding part having a transmittance of about 6% around the hole. A phase around the hole is reversed by 180° relative to the hole.

FIG. 5A is a plane view of a mask pattern or contact hole pattern $MP_{20}$ as a set of the patterns $MP_{21}$ and $MP_{22}$. In the pattern $MP_{21}$, the contact hole CH has a width $W_1$, a pitch $Px_1$ in the X direction, and a pitch $Py_1$ in the Y direction. An array direction is the X or lateral direction, and the contact hole array of each array has a periodic pattern with the pitch $Px_1$. Each contact hole array is aligned with the upper and lower arrays, and forms a set of rectangular patterns. In the pattern $MP_{22}$, the contact hole CH has a width $W_2$, a pitch $Px_2$ in the X direction, and a pitch $Py_2$ in the Y direction. An array direction is the X or lateral direction, and the contact hole array of each array has a periodic pattern with the pitch $Px_2$. In the pattern $MP_{22}$, each contact hole array shifts from the upper and lower arrays by a half pitch of $Px_2/2$, and forms a set of triangular patterns.

Figure 27A:
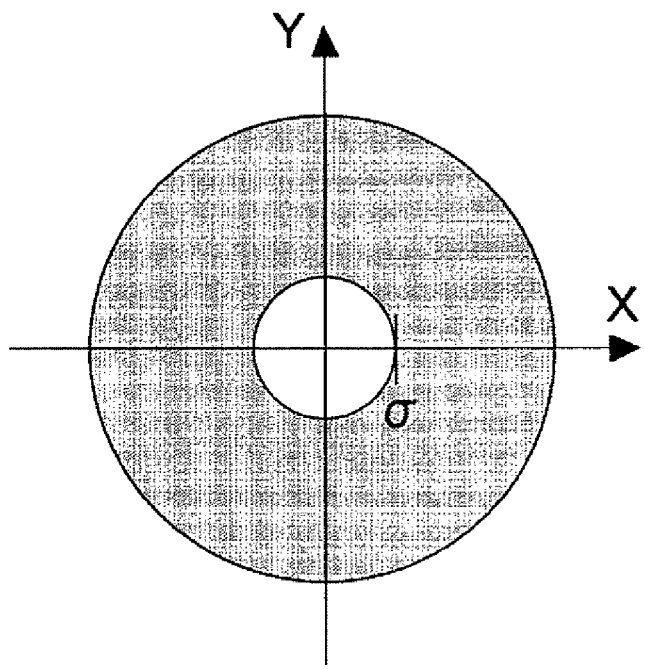
FIG. 27A is a schematic plane view of a circular effective source shape.
Figure 27B:
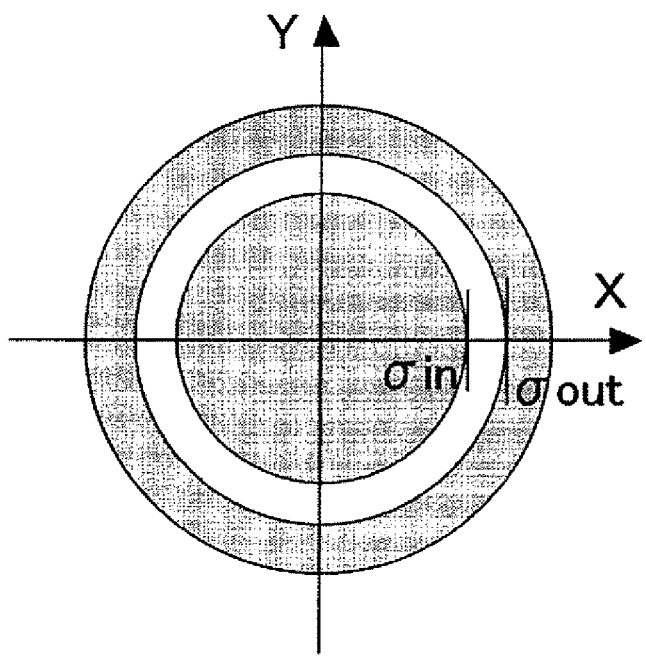
FIG. 27B is a schematic plane view of an annular effective source shape.

A description will be given of the reason why the small σ illumination and the annular illumination shown in FIGS. 27A and 27B are unsuitable for the hybrid pattern shown in FIG. 5A. Here, FIG. 27A is a plane view of the small σ illumination having a circular effective source, and FIG. 27B is a plane view of the annular illumination having an annular effective source. The mask 130 is an attenuated-PSM having a hybrid pattern shown in FIG. 5A, where $W_1=W_2=80$ (nm), $Px_1=Py_1=Px_2=Py_2=P=160$ (nm), and a half pitch of the pattern is 80 nm (k1=0.56 when normalized by λ/NA or k1-converted). An exposure apparatus that has an ArF excimer laser and an NA of 1.35, and provides an annular illumination (with an outer $\sigma_{out}=0.70$ and an inner $\sigma_{in}=0.56$) is used to expose the hybrid pattern, and the resolutions of the left and right patterns shown in FIG. 5A are compared.

Figure 28A:
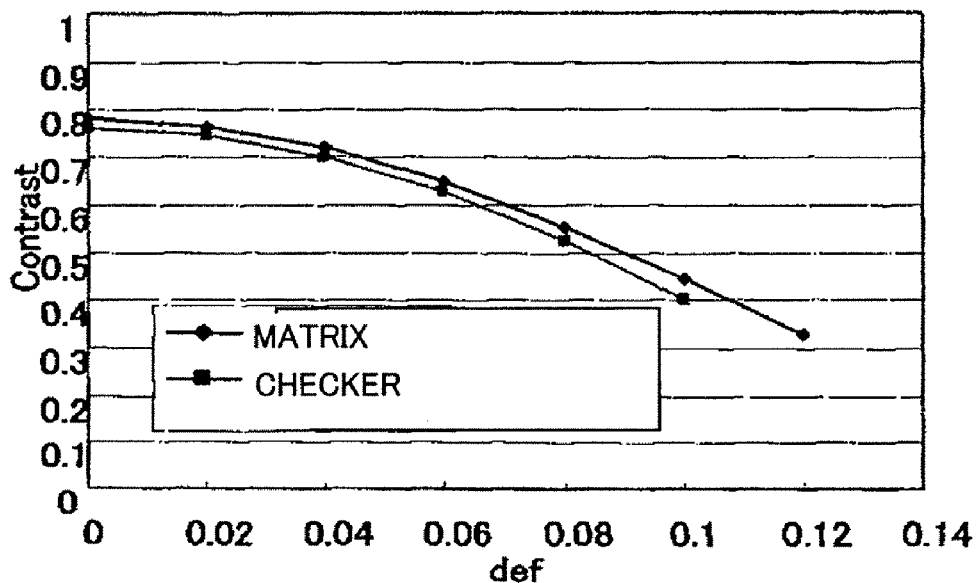
FIG. 28A is a graph showing a relationship between the defocus and the contrast when the effective source shape shown in FIG. 27B illuminates the contact hole pattern shown in FIG. 5A.
Figure 28B:
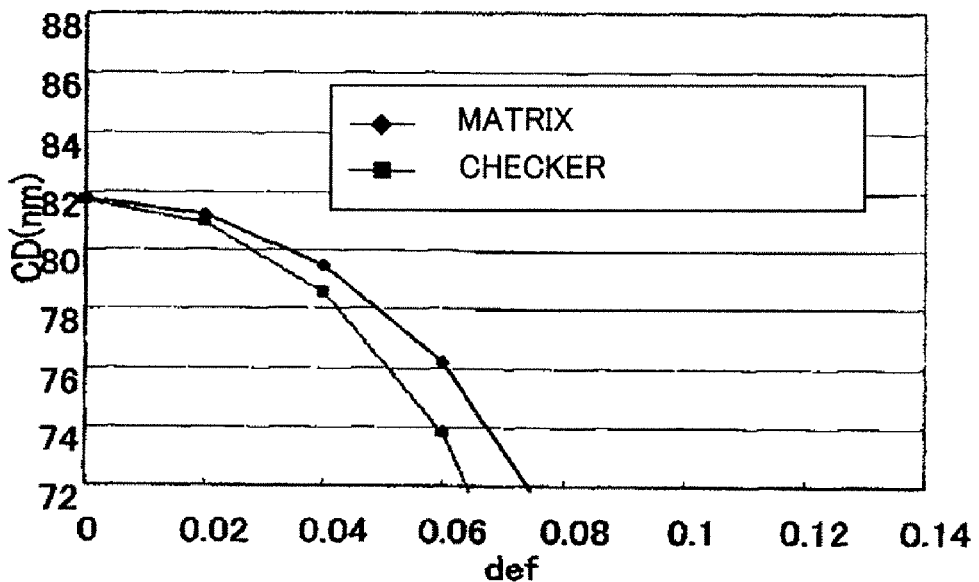
FIG. 28B is a graph showing a relationship between the defocus and the critical dimension ("CD") when the effective source shape shown in FIG. 27B illuminates the contact hole pattern shown in FIG. 5A.

For the defocus, the contrast and the CD of the contact hole CH change as shown in FIGS. 28A and 28B. The vertical axis in FIG. 28B plots a range of ±10% or from 0.9 times to 1.1 times as large as the predetermined width W or from a lower limit 72 (nm) to an upper limit 88 (nm) with respect to the width 80 (nm). A defocus range that allows this variation range is defined as a CD DOF. In other words, the CD DOF is a defocus range that allows the width W of the contact hole CH to vary by ±10% or 0.9 to 1.1 times the predetermined width W. Its contrast is relatively high, and the focus range of ±0.1 μm or a width of 0.2 μm can provide the contrast of 40% or higher. However, its CD change is so large to the defocus, and it cannot obtain a sufficient CD DOF.

Even the small σ illumination shown in FIG. 27A set to the illumination condition provides a similar or lower CD DOF. The CD DOF necessary for the mass production is greater than 0.2 μm for the half pitch of 80 (nm).

A polarization state of the above annular illumination is an unpolarization, but the CD DOF cannot improve even when the polarization state is adjusted.

Figures 5B, 5C:
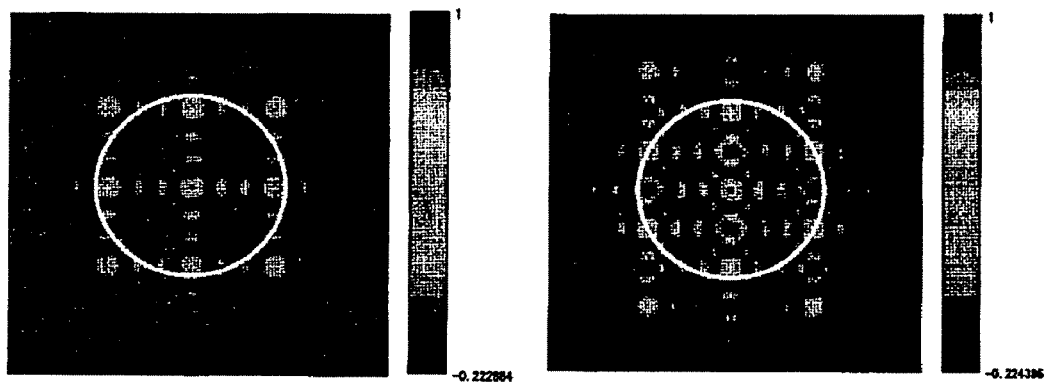
FIG. 5B is a plane view showing diffracted lights from a left pattern shown in FIG. 5A.
FIG. 5C is a plane view showing diffracted lights from a right pattern shown in FIG. 5A.

Both a three-beam interference and a four-beam interference proposed by this embodiment solve this problem. A description will now be given of a resolving method of this embodiment. FIGS. 5B and 5C show distributions of the diffracted lights from the pattern. FIG. 5B shows distribution of the amplitude of the diffraction from the pattern $MP_{21}$ in FIG. 5A with a contact hole width $W_1=80$ (nm) and pitch $Px_1=Py_1,=160$ (nm). FIG. 5B shows the amplitude of the diffracted light from the pattern $MP_{21}$. Eight 1st order diffractions are distributed around the 0th order diffraction like a rectangle. FIG. SC shows distribution of the amplitude of the diffraction from the pattern $MP_{22}$ in FIG. 5A with a contact hole width $W_2=80$ (nm) and pitch $Px_1=Py_1=160$ (nm). Six 1st order diffractions are distributed of around 0th diffraction at the shape of a hexagon.

FIGS. 5B and SC are diffracted light distributions from the binary mask, but which are the same as the diffraction pattern from the attenuated-PSM although an amplitude ratio differs between the 0-th order light and the 1st order diffracted light. FIGS. 5B and SC show, for reference, white circles of a size of the pupil with an NA of 1.35 of the projection optics 140.

The resolution of the pattern $MP_{10}$ needs the interference between the 0-th order light and one or more 1st order diffracted lights. Conceivable candidates are the two-beam interference between the 0-th order light and the 1st order diffracted light, the three-beam interference between the 0-th order light and two beams, the four-beam interference between the 0-th order light and three beams, etc. However, overlaps in two directions are necessary for the two-beam interference to image a hole, and thus the two-beam interference cannot provide sufficient contrast. Therefore, the three-beam interference or higher is preferable, but the number of beams should be maintained smaller for the resolution of a finer pattern.

Figure 6A:
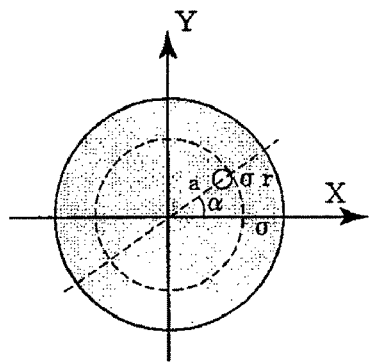
FIG. 6A is a plane view of an effective source.
Figure 6B:
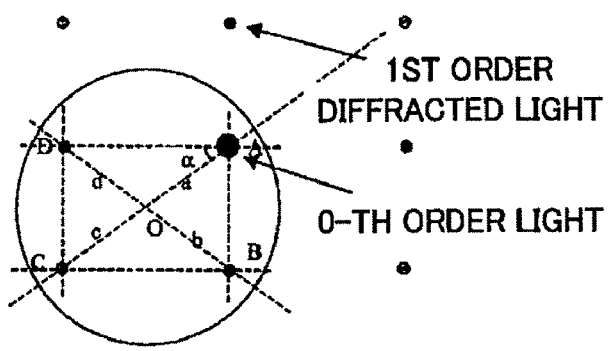
FIG. 6B is a schematic plane view showing a relationship between the pupil and diffracted lights from the effective source shown in FIG. 6A.

Referring now to FIGS. 6A and 6B, a description will be given of conditions for the light from a light source to enable the patterns $MP_{11}$, and $MP_{21}$ to resolve. A point source is shown in FIG. 6A. As shown in FIG. 6B, the 0-th order light from a source is incident upon a position A and other lights are diffracted around the position A. When the 0-th order light and three 1st order diffracted lights are incident at A, B, C, D upon the pupil. Diffracted light at position A is named "light A" or "A". The 0-th order light A and the 1st order diffracted lights B, C, D interfere with each other, making the four-beam interference. The size of the pupil and position of the source for the four-beam interference have the following relationship:

Assume that the pattern $MP_{21}$, has a pitch Px in the X direction and a pitch Py in the Y direction. When the four beams are symmetrically incident upon the center position of the pupil, distances a, b, c and d become equal. The pattern's pitches Px and Py are normalized by λ/NA into Pxo and Pyo as follows:

$$Pxo_1/2 = (Px_1/2) \cdot NA/\lambda \qquad \text{[EQUATION 2]}$$

$$Pyo_1/2 = (Py_1/2) \cdot NA/\lambda \qquad \text{[EQUATION 3]}$$

The following equations are satisfied where α is an angle between AC and AD.

$$AD = BC = 1/Pxo_1 \qquad \text{[EQUATION 4]}$$

$$AB = CD = 1/Pyo_1 \qquad \text{[EQUATION 5]}$$

$$\alpha = \tan^{-1}(Pxo_1/Pyo_1) \qquad \text{[EQUATION 6]}$$

The following equation is satisfied from $2a \sin(\alpha) = 1/Pyo_1$, where distances a, b, c and d are equal to each other:

$$a = b = c = d = 1/(4(Pyo_1/2))/\sin(\alpha) \qquad \text{[EQUATION 7]}$$

When the pupil's center position is set to a point O, the distances a, b, c and d of four beams become equal to each other. In order to place the point O at the pupil's center position, a position of a certain source is arranged at a position apart by a distance "a" defined by Equation 7, and a direction α defined by Equation 6 so that the 0-th order light is distant from the pupil's center position by the distance "a." This is the condition of a polar position of the four-beam interference. Due to the symmetry, this applies to other directions α, π−α, π+α, and 2π−α. The quadrupole illumination is now led.

Figure 12A:
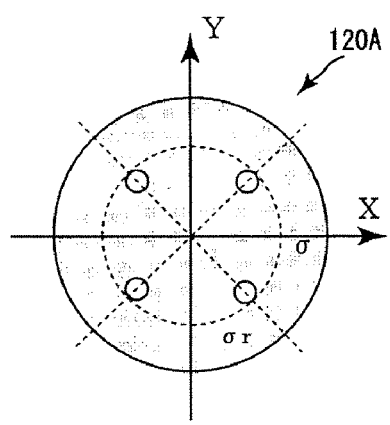
FIG. 12A is a schematic plane view of an effective source shape of a quadrupole illumination suitable for the matrix contact hole pattern.
Figure 12B:
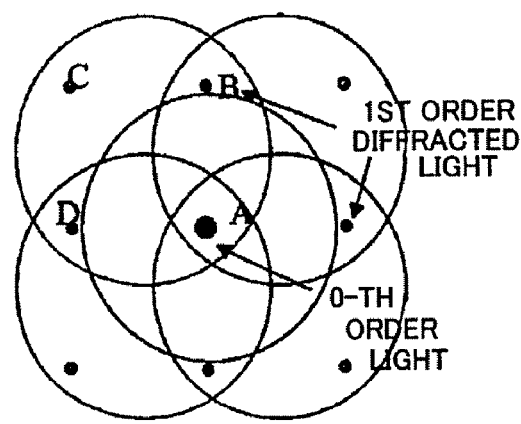
FIG. 12B is a schematic plane view showing a relationship between the diffracted lights and pupil when the effective source shown in FIG. 12A illuminates the matrix contact hole pattern.
Figure 12C:
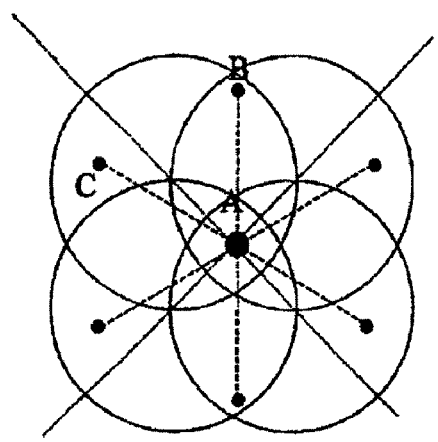
FIG. 12C is a schematic plane view showing a relationship between the diffracted lights and pupil when the effective source shown in FIG. 12A illuminates the checker contact hole pattern.

The quadrupole illumination is suitable for the four-beam interference to enable the pattern $MP_{21}$ to resolve. In this case, as shown in FIG. 12A, the light from one pole in the four poles is diffracted by the pattern, and forms a matrix diffraction pattern, whereby the four beams, i.e., the 0-th order light A and the 1st order diffracted lights B, C and D, pass through the pupil and interfere with each other. The quadrupole illumination is suitable for imaging of the pattern $MP_{21}$, since all the poles of the four poles provide the four-beam interference.

The symmetry of the pattern improves when a direction of each pole of the quadrupole illumination is given as discussed above. The minimum radius of the four beams incident upon the pupil is given as follows:

$$a = b = c = d = 1/(4(Pyo_1/2))/\sin(\alpha) < \qquad \text{[EQUATION 8]}$$

Figure 7:
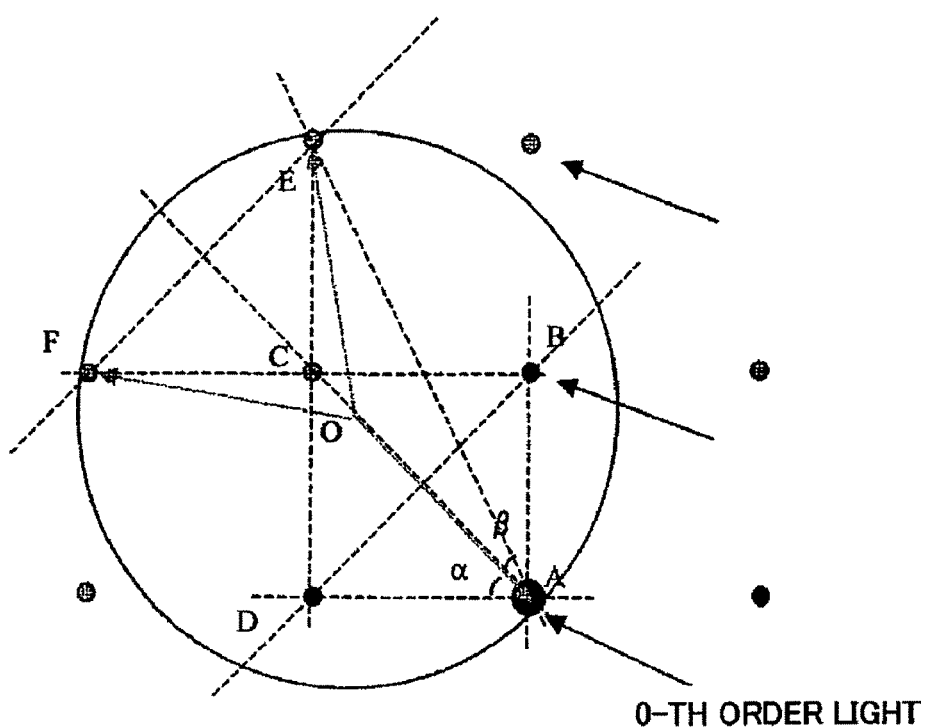
FIG. 7 is a schematic plane view for explaining a maximum radius of the four beams incident upon the pupil for the four-beam interference of the left pattern shown in FIG. 5A.

The maximum radius of the four beams incident upon the pupil is smaller than the circle shown in FIG. 7. When it is maintained equal to or smaller than this circle's radius, only four beams enter the pupil. On the contrary, when the maximum radius is greater than this circle's radius, more than four diffracted lights enter the pupil and aggravate the defocus. Thus, the following equations are satisfied:

$$OA = AE/2/\cos\beta \qquad \text{[EQUATION 9]}$$

$$AE = 2/Pyo_1/\sin(\alpha+\beta) \qquad \text{[EQUATION 10]}$$

$$\beta = \tan^{-1}(2Pxo_1/Pyo_1) - \alpha \qquad \text{[EQUATION 11]}$$

$$OA = \tfrac{1}{2}(Pyo_1/2))/\sin(\alpha+\beta)/\cos\beta > 1 \qquad \text{[EQUATION 12]}$$

The above equations define conditions of the pupil's size in the four-beam interference.

For example, when $Px_1 = Py_1 = P$ in the pattern $MP_{21}$, the following equations are satisfied:

$$Px_1/2 = Py_1/2 \qquad \text{[EQUATION 13]}$$

$$Px_1/2 = Py_1/2 = P/2 \qquad \text{[EQUATION 14]}$$

$$P/2 = k_1\lambda/NA \qquad \text{[EQUATION 15]}$$

Therefore, the condition under which all the four beams are incident upon the pupil is defined as follows from Equation 8:

$$0.25\sqrt{2} < k_1 \; (Px_1/2 = Py_1/2 = k_1\lambda/NA) \qquad \text{[EQUATION 16]}$$

From Equation 12, the following equation defines the condition under which no more than four diffracted lights enter the pupil:

$$k_1 < 0.589 \; (Px_1/2 = Py_1/2 = k_1\lambda/NA) \qquad \text{[EQUATION 17]}$$

Equation 18 is satisfied from Equations 16 and 17:

$$0.354 < k_1 < 0.589 \; (Px_1/2 = Py_1/2 = k_1\lambda/NA) \qquad \text{[EQUATION 18]}$$

The NA that realizes the four-beam interference of the pattern that satisfies Equation 15 is given as follows:

$$0.354\lambda/(P/2) < NA < 0.589\lambda/(P/2) \qquad \text{[EQUATION 19]}$$

A centroid position of the sources is defined as follows:

$$a = 0.354/k_1 \qquad \text{[EQUATION 20]}$$

$$\alpha = 45° \qquad \text{[EQUATION 21]}$$

In this case, the directions of the sources' centroid positions are 45°, 135°, 225°, and 315°. In addition, σ = a + σr.

Since the light used to image the pattern $MP_{21}$ also illuminates the pattern $MP_{22}$ in the hybrid pattern, imaging of the pattern $MP_{22}$ will now be described. The pattern $MP_{21}$, has half pitches $Px_1/2$ and $Py_1/2$, but the pattern $MP_{22}$ has half pitches $Px_2/2$ and $Py_2/2$.

When the pattern $MP_{22}$ is illuminated, as in FIG. 8A, under the condition of the four-beam interference of the pattern $MP_{21}$, the three-beam interference of diffracted lights A, B and E are made as shown in FIG. 8B. Here, FIG. 8A is a plane view showing a relationship between the pupil and the diffracted lights for the four-beam interference of the pattern $MP_{21}$. FIG. 8B is a plane view showing a relationship between the pupil and the diffracted lights for the three-beam interference of the pattern $MP_{22}$.

As the pattern enlarges and the incident angle of the diffracted angle reduces, the pupil radius enlarges relatively to the diffracted angle. As the diffracted angle reduces as shown by a broken line in FIG. 8B, the high order light is incident upon the pupil, and is caused the five-beam interference. When the pupil radius is smaller than the broken line, three beams are incident upon the pupil. In FIGS. 8A and 8B, a length "a" and an angle α are common and equal. Therefore, Equations 6 and 7 are satisfied with respect to α and "a," respectively. The minimum value of the NA satisfies Equation 8 with respect to "a" from the incident condition upon the pupil of the four beams. Since $AB = EF = 1/Pyo_2$ and a length from E to the line AB is $1/Pxo_2$, the NA's maximum value is as follows from the condition under which the three beams are incident upon the pupil.

$$e = 1/(2(Pxo_2/2)) - a \cos(\alpha) \qquad \text{[EQUATION 22]}$$

$$f = 1/(2(Pyo_2/2))/(\sin(\tan^{-1}(1/(2(Pyo_2/2)/e)))) > 1 \qquad \text{[EQUATION 23]}$$

In order to enable the pattern $MP_{22}$ to resolve under the four-beam interference condition of the pattern $MP_{21}$, these relationships must be satisfied among the NA, λ, and pattern pitch. The lower limit of the pattern pitch is defined by Equation 8, and the upper limit is defined by a smaller one of Equations 12 and 23. When the pattern pitch is set between the lower limit and the upper limit, a CD DOF is obtained since the three-beam or four-beam interference is always given.

This condition provides the incident lights to secure the four-beam interference of the pattern $MP_{21}$ and the three-beam interference of the pattern $MP_{22}$, and distribute the diffracted lights approximately symmetrically around the pupil's center position. When more diffracted lights are incident, as shown in FIG. 7, the distribution of the diffracted lights becomes asymmetrical around the pupil's center, and the phase difference of the defocus wavefront increases, and the image characteristic at the defocus degrades. However, such lights are eliminated by Equation 12 or 23. In the previous example, when the pattern $MP_{21}$ has the equal pitches $Px_1$ and $Py_1$, the pattern $MP_{22}$ has equal pitches $Px_2$ and $Py_2$, and $Px_1=Px_2=P$, the following equation defines the condition under which more than four diffracted lights do not enter the pupil:

$$0.354<k_1<0.56\ (Px_1/2=Py_1/2=Px_2/2=Py_2/2=k_1\lambda/NA) \quad \text{[EQUATION 24]}$$

The NA for the three-beam or four-beam interference of the pattern defined by Equation 15 is given as follows:

$$0.354\lambda/(P/2)<NA<0.56\lambda/(P/2) \quad \text{[EQUATION 25]}$$

Referring now to FIGS. 9A and 9B, a description will be given of the imaging condition of the pattern $MP_{22}$ using the light from a point source. A point source is shown in FIG. 9A. As shown in FIG. 9B, the 0-th order light from a source is incident upon a position A and other lights are diffracted around the position A. When the 0-th order light and two 1st order diffracted lights are incident upon the pupil, the 0-th order light at A and the 1st order diffracted lights at B and C interfere with each other, making the three-beam interference. The size of the pupil and position of the source for the three-beam interference are as follows. Assume that the pattern $MP_{22}$ has a pitch $Px_2$ in the X direction and a pitch $Py_2$ in the Y direction. When the three beams are symmetrically incident upon the center position O of the pupil, distances a, b, c become equal. The three-beam interference of diffracted lights A, B, C shown in FIG. 9B will be considered. The pattern's pitches $Px_2$ and $Py_2$ are normalized by $\lambda$/NA into $Pxo_2$ and $Pyo_2$ as in Equations 2 and 3. When the distances a, b, and c are equal to each other, the angle between AM and AC is the same as each of the angle between AC and AM, and the angle between AO and AC, where L is a midpoint of AB, and M is a midpoint of CD. If it is assumed that the angle is $\alpha/2$, then the angle between AM and AO is $\alpha$.

$$AM=CL=1/Pxo_2 \quad \text{[EQUATION 26]}$$

$$AB=CD=1/Pyo_2 \quad \text{[EQUATION 27]}$$

$$\alpha=2\tan^{-1}(Pxo_2/(2Pyo_2)) \quad \text{[EQUATION 28]}$$

The following equation is satisfied from a $\sin(\alpha)=1/Py$:

$$a=b=c=1/(4(Pyo_2/2))/\sin(\alpha) \quad \text{[EQUATION 29]}$$

When the pupil's center position is set to a point O, a position of a source is arranged at a position apart by a distance "a" and a direction $\alpha$ so that they satisfy Equations 7 and 28. This is the condition of a polar position of the three-beam interference. Due to the symmetry, this applies to the directions 0, $\alpha$, $\pi-\alpha$, $\pi$, $\pi+\alpha$, and $2\pi-\alpha$. Thus, a hexapole illumination is led. The directions of respective sources of the hexapole illumination are 0, $\alpha$, $\pi-\alpha$, $\pi$, $\pi+\alpha$, and $2\pi-\alpha$. The hexapole illumination is suitable for the three-beam interference shown in FIG. 13A to image the pattern $MP_{22}$. In this case, as shown in FIG. 13B, the light from one of six poles is diffracted by the pattern, and forms a checker diffraction pattern, whereby the three beams, i.e., the 0-th order light A and the 1st order diffracted lights B and C, pass through the pupil and interfere with each other. The hexapole illumination is suitable for imaging of the pattern $MP_{22}$, since all the poles of the six poles make the three-beam interference. The symmetry of the pattern improves when a direction of each pole of the hexapole illumination is defined as discussed above. The minimum radius of the three beams incident upon the pupil is given as follows:

$$a=b=c=1/(4(Pyo_2/2))/\sin(\alpha)<1 \quad \text{[EQUATION 30]}$$

Figure 10:
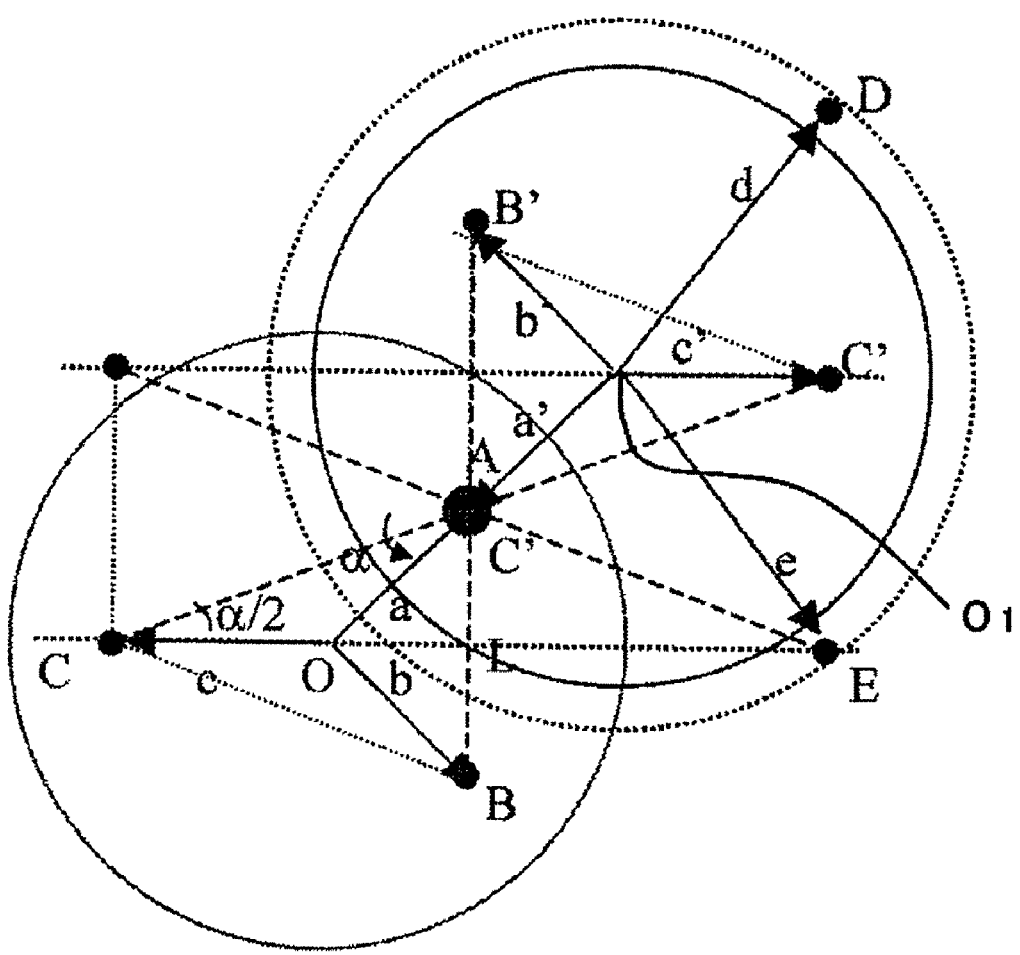
FIG. 10 is a schematic plane view for explaining a maximum radius of the three beams incident upon the pupil for the three-beam interference of the right pattern shown in FIG. 5A.

The maximum radius of the three beams incident upon the pupil is smaller than that of the circle shown in FIG. 10. For the point O and $O_1$ as a center of the pupil, for example, as shown in FIG. 10, and a=b=c=a'=b'=c' is satisfied. The maximum radius equal to or smaller than this circle's radius allows only three beams to enter the pupil. However, when the radius is greater than this circle's radius, more than three diffracted lights would enter the pupil and the defocus aggravates. Thus, the following equations are satisfied:

$$d=e=1/(2(Pyo_2/2))/(\sin(\tan^{-1}(1/(2(Pyo_2/2))/a))>1 \quad \text{[EQUATION 31]}$$

The above equations define conditions of the pupil's size in the three-beam interference.

For example, when the half pitches satisfy $Px_2=Py_2=P$, and pattern's half pitch is normalized by $\lambda$/NA and expressed by $k_1$, $a=1/(3.2k_1)$, $\alpha=53°$, and the pole's centroid position is $1/(3.2k_1)$. When the directions of respective poles in the hexapole illumination are set to 53°, 127°, 180°, 233°, and 307°, the symmetry of the pattern improves. Since the minimum resolving power is $1/(3.2k_1)<1$, the following equations are satisfied:

$$k_1>0.3125\ (Px_2/2=Py_2/2=k_1\lambda/NA) \quad \text{[EQUATION 32]}$$

$$0.3125<k_1<0.589\ (Px_2/2=Py_2/2=k_1/NA) \quad \text{[EQUATION 33]}$$

For the fixed size (NA) of the pupil, the pattern's half pitches are set as in Equation 33. For the fixed pattern's half pitches, the size (NA) of the pupil is set as follows:

$$0.31\lambda/(P/2)<NA<0.59\lambda/(P/2) \quad \text{[EQUATION 34]}$$

Since the light used to image the pattern $MP_{22}$ also illuminates the pattern $MP_{21}$ in the hybrid pattern, imaging of the pattern $MP_{21}$ will now be described.

The pattern $MP_{21}$ has half pitches $Px_1/2$ and $Py_1/2$, but the pattern $MP_{22}$ has half pitches $Px_2/2$ and $Py_2/2$.

Figure 11A:
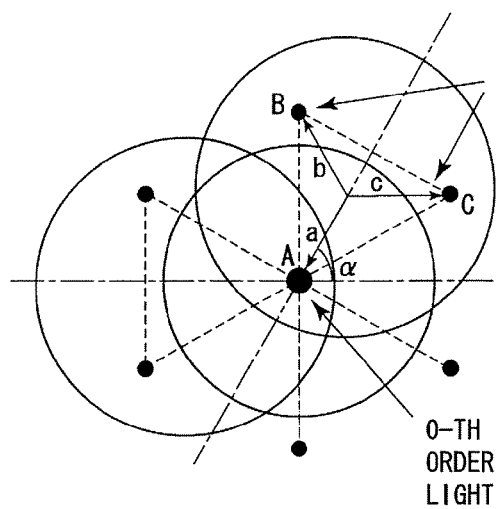
FIG. 11A is a plane view showing a relationship between the pupil and the diffracted lights for the three-beam interference of the right pattern shown in FIG. SA.
Figure 11B:
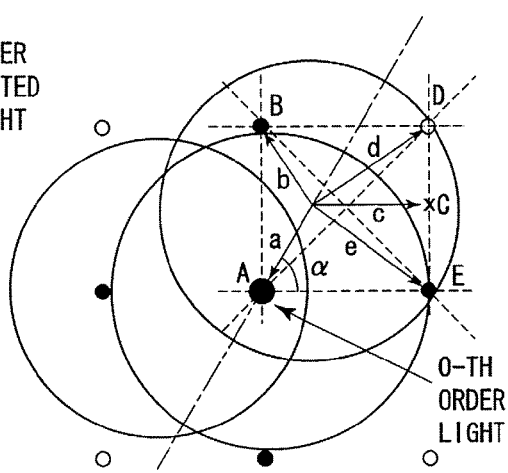
FIG. 11B is a plane view showing a relationship between the pupil and the diffracted lights for the four-beam interference of the left pattern shown in FIG. 5A.

When the pattern $MP_{21}$ is illuminated, as in FIGS. 11A and 11B, under the condition of the three-beam interference of the pattern $MP_{22}$, the four-beam interference of diffracted lights A, B, E and D is made as shown in FIG. 11B. Here, FIG. 11B is a plane view showing a relationship between the pupil and the diffracted lights for the four-beam interference of the pattern $MP_{21}$. FIG. 11A is a plane view showing a relationship between the pupil and the diffracted lights for the three-beam interference of the pattern $MP_{22}$. In FIGS. 11A and 11B, a length "a" and an angle $\alpha$ are common and equal. First, Equations 28 and 29 are established with the following equations:

$$AE=BD=1/Pxo_1 \quad \text{[EQUATION 35]}$$

$$AB=DE=1/Pyo_1 \quad \text{[EQUATION 36]}$$

The minimum radius of the four beams incident upon the pupil is larger than that of a circle shown in FIG. 11B.

$$c=1/(2Pxo_1/2)-a\cos(\alpha) \quad \text{[EQUATION 37]}$$

$$d=e=1/(4(Pyo_1/2))/\sin(\tan^{-1}(4(Pyo_1/2))/c))>1 \quad \text{[EQUATION 38]}$$

In order to enable the pattern $MP_{21}$ to resolve under the three-beam interference condition of the pattern $MP_{22}$, these relationships must be satisfied among the NA, $\lambda$, and pattern pitch. The lower limit of the pattern pitch is defined by a larger one of Equations 30 and 38, and the upper limit is defined by the pattern pitch of Equation 31. When the pattern pitch is set between the lower limit and the upper limit, a CD DOF is obtained.

This condition provides the four-beam interference of the pattern $MP_{21}$ and the three-beam interference of the pattern $MP_{22}$. Equation 38 eliminates the condition under which more diffracted lights are incident.

In the previous example, when the pattern $MP_{21}$ has the equal pitches $Px_1$ and $Py_1$, the pattern $MP_{22}$ has the equal pitches $Px_2$ and $Py_2$, and $Px_1=Px_2=P$, the following equation defines the condition under which more than four diffracted lights do not enter the pupil. Equation 37 is as follows from $a=b=c=1/(3.2k_1)$ and $\alpha=2\tan^{-1}(0.5)$:

$$d=e=1/(4k_1)/\sin(\tan^{-1}((3.2k_1)/(4k_1)))>1 \ (Px_2/2=Py_2/2=k_1\lambda/NA) \quad [\text{EQUATION 39}]$$

$$k_1>0.40 \ (Px_2/2=Py_2/2=k_1\lambda/NA) \quad [\text{EQUATION 40}]$$

The following equation with respect to the NA's maximum value from the condition under which the three beams are incident upon the pupil:

$$k_1<0.59 \ (Px_2/2=Py_2/2=k_1\lambda/NA) \quad [\text{EQUATION 41}]$$

Therefore, the following equation is satisfied:

$$0.40<k_1<0.59 \quad [\text{EQUATION 42}]$$

As discussed above, when Equation 14 is satisfied, Equation 42 gives the condition for the three-beam or four-beam interference. From Equation 15, the NA's condition is as follows:

$$0.40\lambda/(P/2)<NA<0.59\lambda/(P/2) \quad [\text{EQUATION 43}]$$

In addition, a description will be given of a hexapole illumination that is not suitable, when the axial source provides the four-beam interference of the pattern $MP_{21}$. The hexapole illumination is suitable for the three-beam interference of the pattern $MP_{22}$, but this is not the case in the four-beam interference of the pattern $MP_{21}$. The hexapole illumination shown in FIG. 14A enables the pattern $MP_{21}$ to resolve as shown in FIG. 14B. A non-axial source S5 among six sources S1 to S6 in the hexapole illumination provides four-beam interference of A to D as shown in FIG. 14B. An axial source S1 in the hexapole illumination provides the two-beam interference of A and G or asymmetrical four-beam interference of A, G, E, and F, aggravating the asymmetry in the X and Y direction.

All of the four sources S2, S3, S5 and S6 provide the four-beam interference, but the axial sources S1 and S4 do not provide the four-beam interference similar to the other four sources, thus S1 and S4 degrade the resolving characteristic of the pattern $MP_{21}$. Understandably, except for the axial sources S1 and S4, the three-beam interference of the pattern $MP_{22}$ has a good resolving characteristic similar to the four-beam interference of the pattern $MP_{21}$.

A description will now be given of a polarization state in the three-beam interference or the four-beam interference. For example, an NA of 1.35 is expected in the immersion exposure apparatus. Water has a refractive index of about 1.44. In an optical system having an NA of 1.35 and a maximum incident angle of $\theta$, $\theta=70°$ from $NA=\sin\theta$ and $n=1.44$. As well known, in higher NA systems, it is desirable to optimize polarization as much as possible.

Figure 15A:
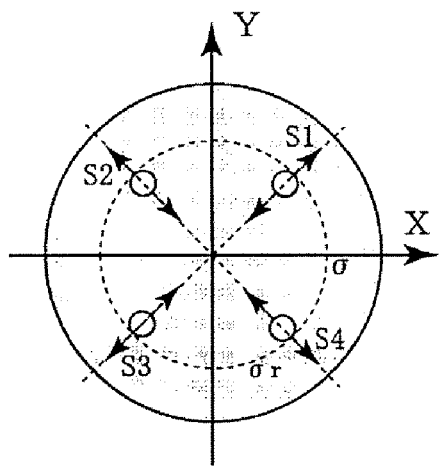
FIG. 15A is a plane view of an effective source shape of a radially polarized quadrupole illumination for illuminating the pattern shown in FIG. 5A.
Figure 15B:
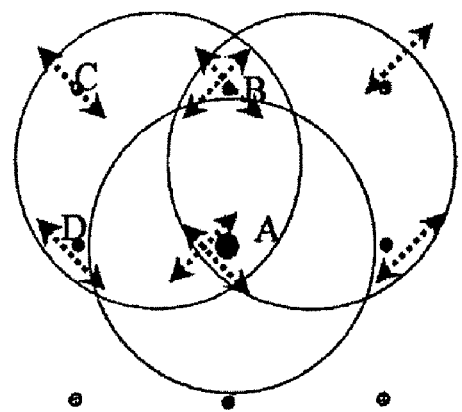
FIG. 15B is a plane view showing a relationship between the pupil and the diffracted lights for the four-beam interference of the left pattern shown in FIG. 5A.
Figure 15C:
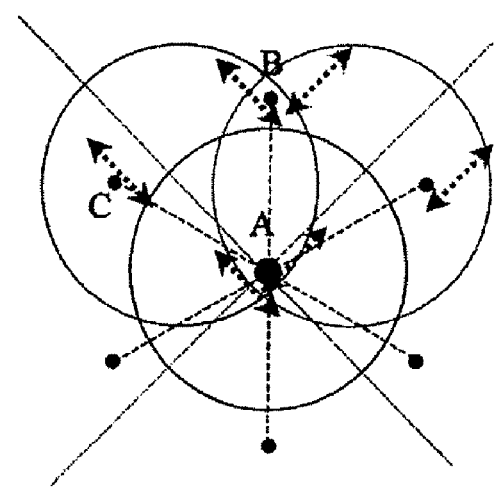
FIG. 15C is a plane view showing a relationship between the pupil and the diffracted lights for the three-beam interference of the right pattern shown in FIG. 5A.

A radial polarization is suitable for the attenuated-PSM, even in the three-beam interference or four-beam interference, as shown in FIGS. 15A to 15C. While a tangential polarization is suitable for the three-beam interference of the binary mask, but a radial polarization is suitable for the four-beam interference. For the binary mask, the unpolarized illumination is not problem since both polarizations are less influential.

FIG. 15A shows the quadrupole illumination using the radially polarized light for illuminating the patterns $MP_{21}$ and $MP_{22}$. FIG. 15B is a plane view showing a relationship between the pupil and the diffracted lights for the four-beam interference of the pattern $MP_{21}$. FIG. 15C is a plane view showing a relationship between the pupil and the diffracted lights for the three-beam interference of the pattern $MP_{22}$. Since the diffracted lights from the mask 130 are same polarization as the incident light ideally, the 0-th order light and the 1st order diffracted light have the same polarization.

FIG. 15B shows the four beams, i.e., the 0-th order light A and the 1st order diffracted lights B, C, and D from the sources S3 and S4. Regarding the source S4, the 0-th order light A and the 1st order diffracted lights B, C, and D provide the four-beam interference, and the radial polarization provides polarized directions shown in FIG. 15B to the diffracted lights A, B, C, and D, and causes a constructive interference between B and D. Since B and D have the same amplitude, the 0-th order light A and the 1st order light have different sign and size in amplitude in case of the attenuated-PSM. Similarly, the 0-th order light A and the 1st order diffracted light B and C provide the three-beam interference, and the radial polarization provides polarized directions shown in FIG. 15C to the diffracted lights at A, B and C, and causes a constructive interference between B and C.

In case of the attenuated-PSM, the tangential polarization causes a destructive interference. However, in case of the binary mask, when a pitch reduces in the three-beam interference of the pattern $MP_{22}$, the illumination light can use a tangential polarization. Since the 0-th order light A and the 1st order diffracted lights B and C have the same sign of the amplitude, a higher contrast can be obtained by interference of two pairs AB and AC than that of BC. In the binary mask, the polarization difference is not significantly influential to the three-beam interference and the four-beam interference, and a non-polarized light may be used.

Figure 16A:
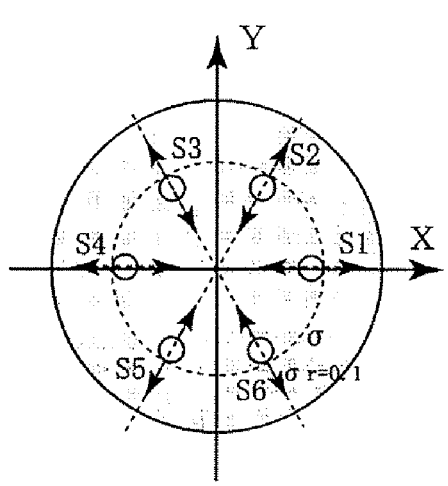
FIG. 16A is a plane view showing a radially polarized hexapole illumination.
Figure 16B:
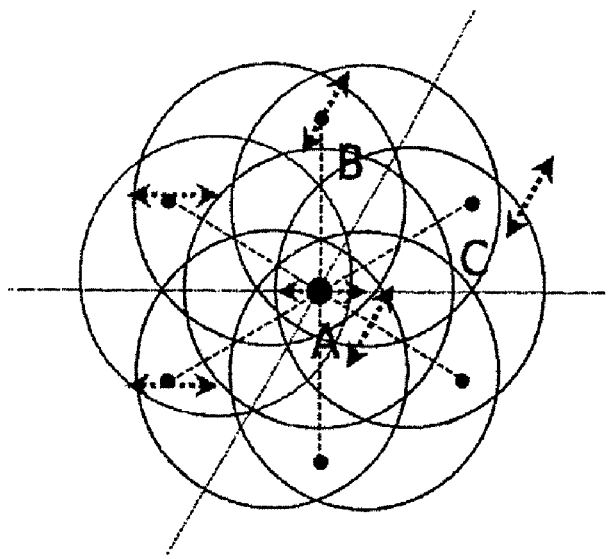
FIG. 16B is a plane view showing a relationship between the diffracted lights and the pupil when the effective source shown in FIG. 16A illuminates the right pattern shown in FIG. 5A.
Figure 16C:
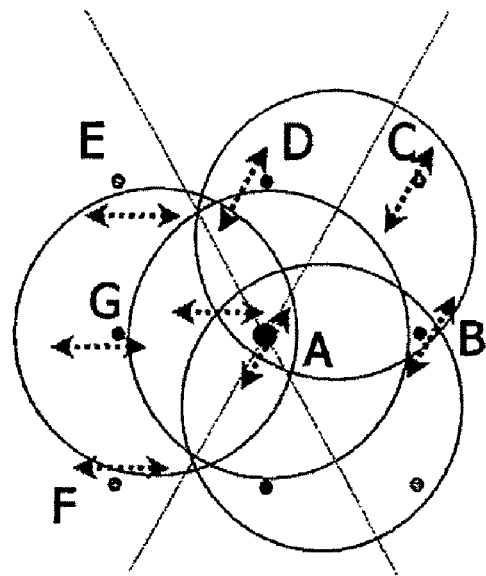
FIG. 16C is a plane view showing a relationship between the diffracted lights and the pupil when the effective source shown in FIG. 16A illuminates the left pattern shown in FIG. 5A.

The description of that is similarly applied to the four non-axial sources when the hexapole illumination using a radial polarization shown in FIG. 16A illuminates the pattern $MP_{20}$. Axial sources provide the two-beam interference between A and G or the four-beam interference between A, G, E and F. But the interference between A and G is destructive, and the interference between E and F contributes to contrast in the Y direction but does not contribute to contrast in the X direction.

Figure 2B:
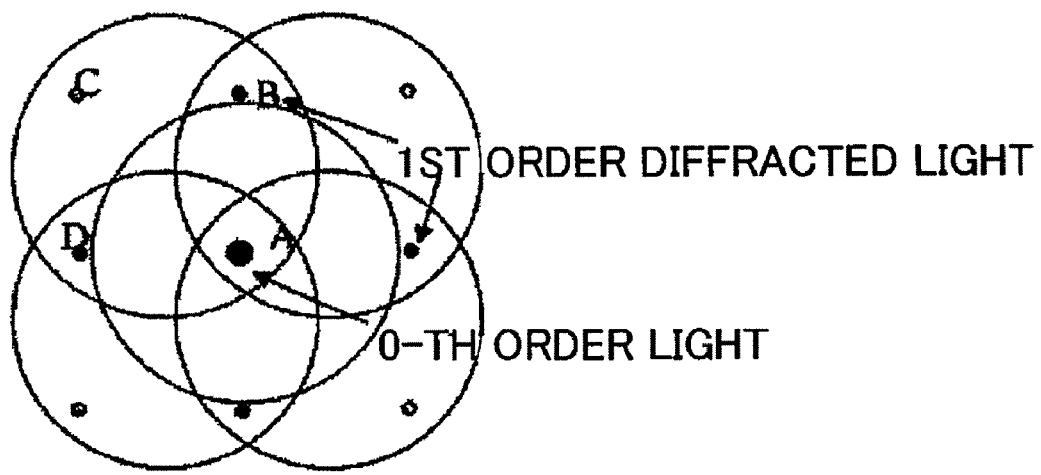
FIG. 2B is a schematic plane view showing a relationship between diffracted lights and a pupil when an effective source shown in FIG. 2A illuminates a matrix contact hole pattern.
Figure 2C:
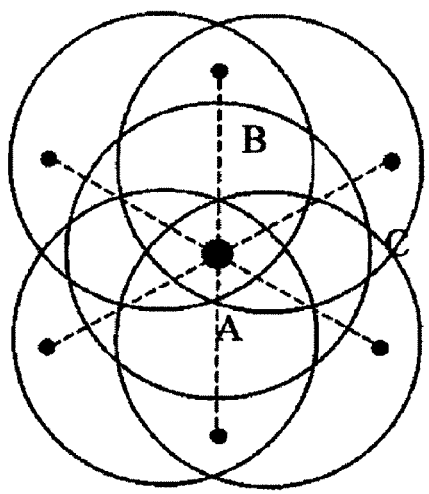
FIG. 2C is a schematic plane view showing a relationship between diffracted lights and the pupil when the effective source shown in FIG. 2A illuminates a checker contact hole pattern.

As described above, a quadrupole illumination that excludes the on-axial illumination is suitable for the illumination method of the hybrid pattern MP as shown in FIG. 2A. Quadrupole illumination as shown in FIG. 15A added to quadrupole illumination that excludes the on-axial illumination makes octapole illumination as shown in FIG. 2. Thus an octapole illumination can be used, or a quadrupole shown in FIG. 3 may be used when the pattern $MP_{21}$, and the pattern $MP_{22}$ have a similar pitch.

Plural pitches can be generalized, for example, when the matrix pattern $MP_{21}$ has $n_i$ pitches, and checker pattern $MP_{22}$ has $n_j$ pitches. In that case, in order to satisfy the optimal exposure condition of the patterns $MP_{21}$, and $MP_{22}$, there are set sources that have a center position $a_i$, and are located in four directions at angles $\alpha_i, \pi-\alpha_i, \pi+\alpha_i, 2\pi-\alpha_i$ from the array direction, and sources that have a center position $a_j$, and are located in four directions at angles $\alpha_j$, $\pi-\alpha_j$, $\pi+\alpha_j$, $2\pi-\alpha_j$ from the array direction.

$$Pxo_i/2=(Px_i/2)NA/\lambda, 1\leq i\leq n_i \quad \text{[EQUATION 44]}$$

$$Pyo_i/2=(Py_i/2)NA/\lambda, 1\leq i\leq n_i \quad \text{[EQUATION 45]}$$

$$Pxo_j/2=(Px_j/2)NA/\lambda, 1\leq j\leq n_j \quad \text{[EQUATION 46]}$$

$$Pyo_j/2=(Py_j/2)NA/\lambda, 1\leq j\leq n_j \quad \text{[EQUATION 47]}$$

$$\alpha_i=\tan^{-1}(Pxo_i/Pyo_i), 1\leq i\leq n_i \quad \text{[EQUATION 48]}$$

$$\alpha_j=2\tan^{-1}(Pxo_j/(2Pyo_j)), 1\leq j\leq n_J \quad \text{[EQUATION 49]}$$

$$a_i=1/(4(Pyo_i/2))/\sin(\alpha_i), 1\leq i\leq n_i \quad \text{[EQUATION 50]}$$

$$a_j=1/(4(Pyo_j/2))/\sin(\alpha_j), 1\leq j\leq n_j \quad \text{[EQUATION 51]}$$

A relationship among the NA, $\lambda$, and pattern pitch should satisfy the following equations for the three-beam interference or the four-beam interference.

Three inequalities of Equations 52, 53 and 54 should be set $\alpha_i$ and $a_i$.

Three inequalities of Equations 55, 56 and 57 should be set $\alpha_j$ and $a_j$.

For a wide range of a pattern pitch that cannot satisfy these inequalities, an auxiliary pattern, which will be described later, is inserted to reduce the pitch down to a permissible range that can satisfy the inequalities. In the example that has a pitch of 1.5 times or twice as large as the minimum pitch, which will be described later, a pitch becomes half by inserting the auxiliary pattern into the target or predetermined pattern.

$$1/(4(Pyo_i/2))/\sin(\alpha_i)<1, 1\leq i\leq n_i \quad \text{[EQUATION 52]}$$

$$1/(2(Pyo_i/2)/\sin(\alpha_i+\beta_i)/\cos(\beta_i)>1, \beta_{i=tan}^{-1}(2Pxo_i/Pyo_i)-\alpha_i, 1\leq i\leq n_i \quad \text{[EQUATION 53]}$$

$$1/(2(Pyo_j/2))/(\sin(\tan^{-1}(1/(2(Pyo_j/2))/e_j)))>1\ e_j=1/(2(Pxo_j/2))-a_i\cos(\alpha_i), 1\leq j\leq n_j \quad \text{[EQUATION 54]}$$

$$1/(4(Pyo_j/2))/\sin(\alpha_j)<1, 1\leq j\leq n_j \quad \text{[EQUATION 55]}$$

$$1/(2(Pyo_j/2)/(\sin\tan^{-1}(1/(2(Pyo_j/2))/a_j)>1, 1\leq j\leq n_j \quad \text{[EQUATION 56]}$$

$$1/(4(Pyo_i/2))/(\sin(\tan^{-1}(1/(4(Pyo_i/2)/c_i)))>1, c_i=1/(2(Pxo_i/2))-a_j\cos(\alpha_j), 1\leq i\leq n_i \quad \text{[EQUATION 57]}$$

When the pattern pitch is variable, the pattern $MP_{22}$ may have a greater pitch than that of the pattern $MP_{21}$ so that the centroid positions of the four sources accord with each other as the optimal exposure condition of the pattern MP. In other words, the pattern $MP_{21}$ have a pitch Px=Pxo in the X direction, and a pitch Py=Pyo in the Y direction, a ratio between the pitch in the X direction and the pitch in the Y direction is made almost equal to each other, and the pattern $MP_{22}$ has pitches Pxb and Pyb as follows:

$$Pxbo=(Pxb/\lambda)NA \quad \text{[EQUATION 58]}$$

$$Pybo=(Pyb/\lambda)NA \quad \text{[EQUATION 59]}$$

Here, d is defined as follows:

$$Pxo/Pyo=Pxbo/(Pybo)=d \quad \text{[EQUATION 60]}$$

Then, the following equation is satisfied:

$$\alpha_1=\tan^{-1}(d) \quad \text{[EQUATION 61]}$$

$$\alpha_2=2\tan^{-1}(d/2) \quad \text{[EQUATION 62]}$$

Equation 64 is satisfied since Equation 63 is satisfied in order to make $a_1=a_2=a$:

$$a=1/(2Pybo)/\sin(\alpha_2)=1/(2Pyo)/\sin(\alpha_1) \quad \text{[EQUATION 63]}$$

$$Pybo=Pyo\cdot\sin(\alpha_1)/\sin(\alpha_2) \quad \text{[EQUATION 64]}$$

Here, C is defined as follows:

$$C=(-1+\sqrt{(1+d^2)})/d \quad \text{[EQUATION 65]}$$

Then, the following equation is satisfied:

$$Pybo/Pyo=c(4+d^2)/2d/(1+c^2) \quad \text{[EQUATION 66]}$$

When Px/Py=Pxb/(Pyb)=d=1 is satisfied, Pyb/Py=Pxb/Px=0.884 is satisfied. Therefore, when the pattern $MP_{22}$ has 0.884 times a pitch, the centroid positions "a" of four sources accord with each other.

Eight or six auxiliary patterns are placed around the isolated pattern as shown in FIGS. 22A and 22B when there is an isolated hole pattern. The auxiliary pattern is smaller than the isolated hole pattern. FIG. 22A and 22B show the auxiliary pattern as a white hole, and the surrounding auxiliary pattern as a gray hole. The auxiliary pattern is smaller than the desired pattern, and has such a size that it facilitates imaging of the desired pattern, but the auxiliary pattern does not resolve.

The width S of the auxiliary pattern should be between 0.6 and 0.8 times the pattern's half pitch Px/2. The lateral pitch Px and the longitudinal pitch Py of the auxiliary pattern must be accorded with the minimum pitch of the dense pattern. Alternatively, when there is a pitch different from the dense pattern, the auxiliary pattern is placed so that a uniform pitch can be obtained.

Figures 24A, 24B, 24C:
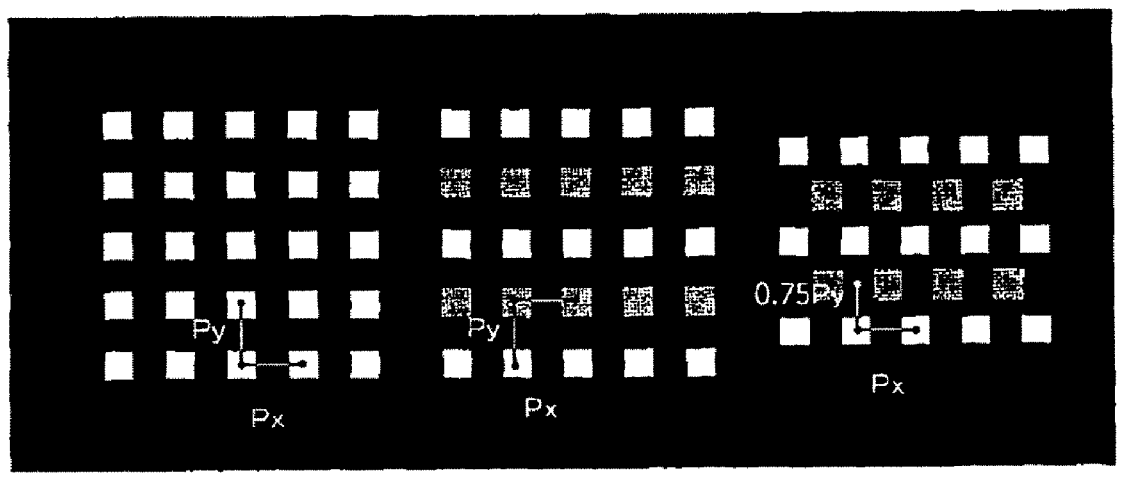
FIG. 24A is a plane view of the matrix contact hole pattern shown in FIG. 23A.
FIG. 24B is a plane view of the matrix contact hole pattern shown in FIG. 23B into which an auxiliary pattern is inserted.
FIG. 24C is a plane view of a checker pattern by inserting an auxiliary pattern into the matrix contact hole pattern shown in FIG. 23C.

For example, assume the pitches Py, 2Py, and 1.5Py as shown in FIGS. 23A to 23C. An auxiliary pattern is arranged in the middle of the hole array as shown in FIG. 24B into the pattern having the pitch 2Py shown in FIG. 23B. FIGS. 24A and 24B may have the same pitch. Such an arrangement cannot be made on the pattern of the pitch 1.5Py shown in FIG. 23C. In that case, the dense pattern has a pitch Px in the X direction, and a pitch Py in the Y direction. In this case, as shown in FIG. 24C, the auxiliary pattern can be arranged in the middle of the hole array with the pitch 2Py to make a dense pattern having a pitch Py, and shifted by a half pitch for the pitch 1.5 Py in the X direction. In the latter case, the pitch becomes 0.75Py. The pattern shown in FIG. 23A is the same as the pattern shown in FIG. 24A. FIG. 24B and 24C show the auxiliary pattern as a white hole, and the surrounding auxiliary pattern as a gray hole. The auxiliary pattern is smaller than the desired pattern, and has such a size that it facilitates imaging of the desired pattern, but the auxiliary pattern does not resolve.

Equation 61 is satisfied when Pxo/Pyo=d is satisfied in the dense pattern shown in FIG. 24A and the dense pattern shown in FIG. 24B having a square grating including a central auxiliary pattern. The optimal exposure condition is given as follows:

$$a_1=1/(2Pyo)/\sin(\alpha_1) \quad \text{[EQUATION 67]}$$

When Px=Py, "a" is given as follows:

$$a_1=1/(1.424\cdot Pybo) \quad \text{[EQUATION 68]}$$

On the other hand, the optimal exposure condition of the pattern shown in FIG. 24C is given as follows:

$$\alpha_2=2\cdot\tan^{-1}(d/1.5) \quad \text{[EQUATION 69]}$$

$$a_2=1/(1.5Pyo)/\sin(\alpha_2) \quad \text{[EQUATION 70]}$$

When Px=Py, "a" is given as follows:

$$a_2=1/(1.385\cdot Pybo) \quad \text{[EQUATION 71]}$$

An octapole illumination shown in FIG. 2 may be set to the optimal exposure condition, or a quadrupole illumination shown in FIG. 3 may be set to the optimal exposure condition since $a_1$, and $a_2$ are very close in Equations 68 and 71. At that time, a size correction or bias is necessary using the size of the desired pattern except for the auxiliary pattern.

First Embodiment

This embodiment uses an immersion exposure apparatus that uses an ArF excimer laser and an NA of 1.35 to wholly image the pattern $MP_{20}$. The mask is an attenuated-PSM. The water's refractive index is about 1.44. An analysis result will be given of the imaging characteristic of the quadrupole illumination using the contrast and the CD DOF as evaluation criteria. The contrast is defined from the maximum and minimum values of the light intensity on the X section. The contrast on the X and Y sections can be similarly defined in the pattern $MP_{21}$, whereas a definition of the contrast on the Y section cannot be similar to that on the X section in the pattern $MP_{22}$, because the contact holes are arranged every other array.

The exposure process is unavoidable with the exposure dose error and the focus setting error, but the contact holes should be produced on the image plane within the actual permissible range. It is said that the contrast of 40% or higher is necessary for the resist to resolve. In other words, when W is a predetermined contact hole width to a variation of the exposure dose of 5%, the depth of focus (DOF) is defined as a focus range that enables a contact hole width to fall between 90% and 110% on the image plane, and satisfies the contrast of 40% or higher.

The quadrupole illumination is used to image the pattern $MP_{20}$ of Equation 14 that has the same pitch in the longitudinal direction and the lateral direction. The contrast and the DOF are shown when the above immersion exposure apparatus is used to image the pattern while varying the contact hole pitch. The mask uses an attenuated-PSM. First, the way of variation of the contrast depending upon the polarization direction is studied.

The effective source is the quadrupole illumination shown in FIG. 3 with $\sigma=0.70$ and ⅘ annulus (annulus inside $\sigma=0.56$), and a central angle of 30° is cut out. The radial polarization shown in FIG. 15A, the tangential polarization orthogonal to the radial polarization, and an unpolarization are compared.

Figure 18A:
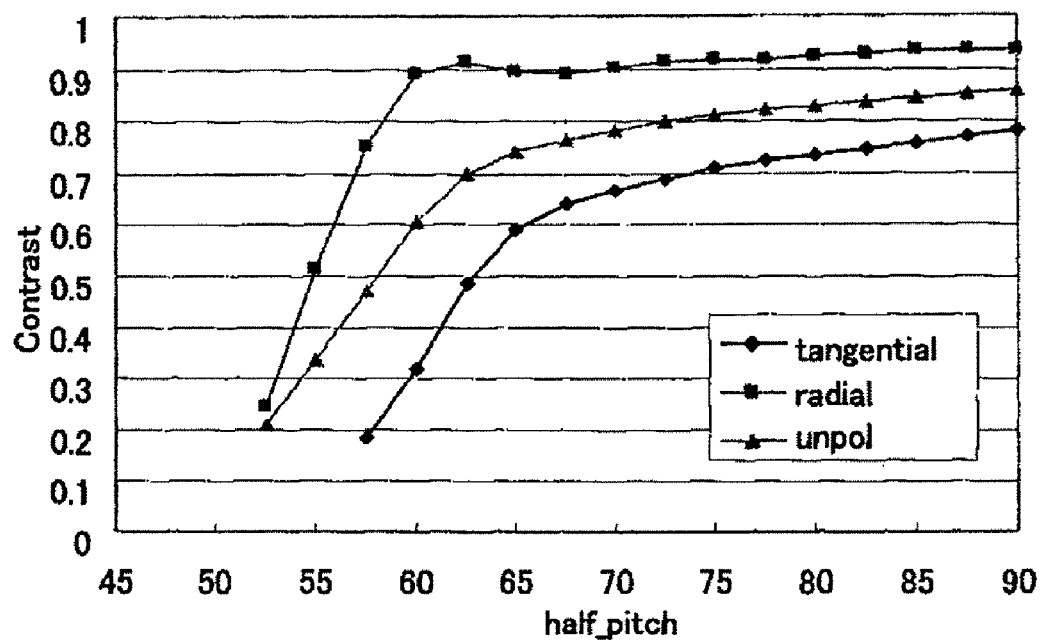
FIG. 18A is a graph showing a polarization characteristic between the half pitch and the contrast when the quadrupole illumination illuminates the left pattern shown in FIG. 5A according to a first embodiment of the present invention.
Figure 18B:
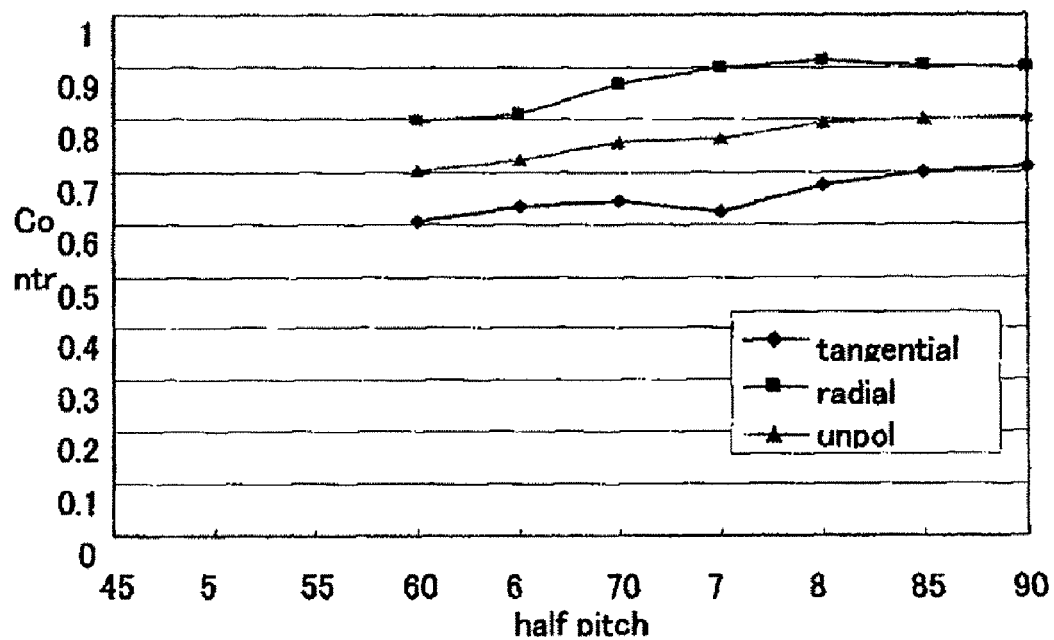
FIG. 18B is a graph showing a polarization characteristic between the half pitch and the contrast when the quadrupole illumination illuminates the right pattern shown in FIG. 5A according to the first embodiment of the present invention.

FIG. 18A shows a contrast on the X section of the pattern $MP_{21}$. FIG. 18B shows a contrast on the X section of the pattern $MP_{22}$. The horizontal axis denotes the half pitch of the contact hole (nm), and the vertical axis denotes the contrast peak. It is understood from FIGS. 18A and 18B that the radial polarization provides a higher contrast to both the patterns $MP_{21}$ and $MP_{22}$. Under this illumination condition, the contrast on the X section of the pattern $MP_{21}$ accords with that on the Y section of the pattern $MP_{21}$. Although the X section is asymmetrical to the Y section in the pattern $MP_{22}$, the radial polarization is superior even for the Y section.

Figure 19A:
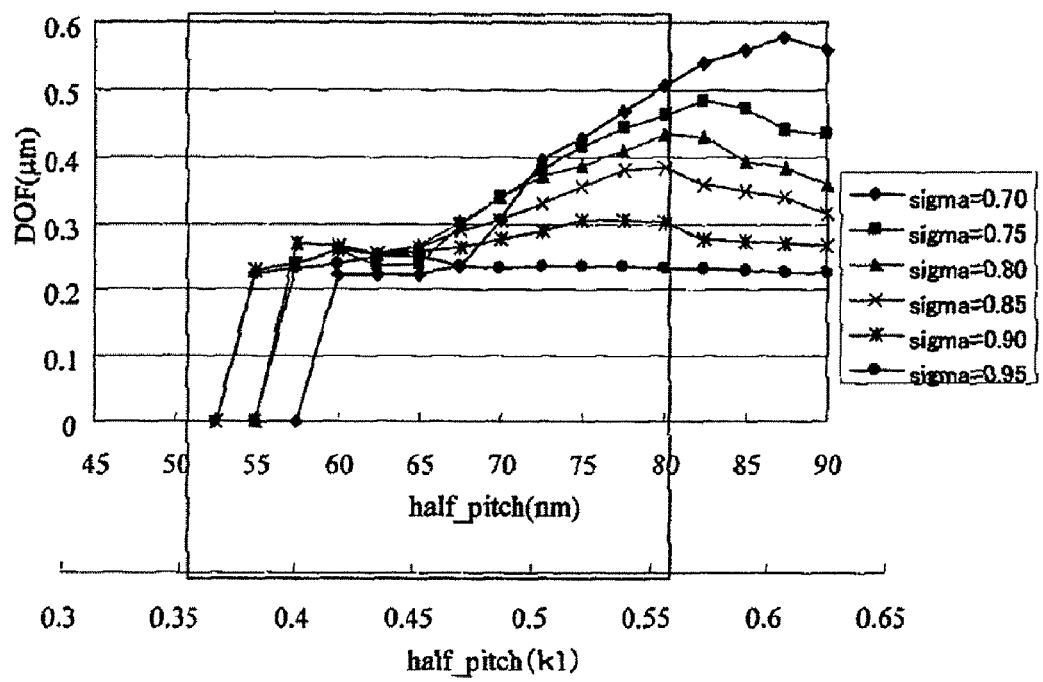
FIG. 19A is a graph showing a σ characteristic between the half pitch and the DOF when the effective source shown in FIG. 15A illuminates the left pattern shown in FIG. 5A according to the first embodiment of the present invention.
Figure 19B:
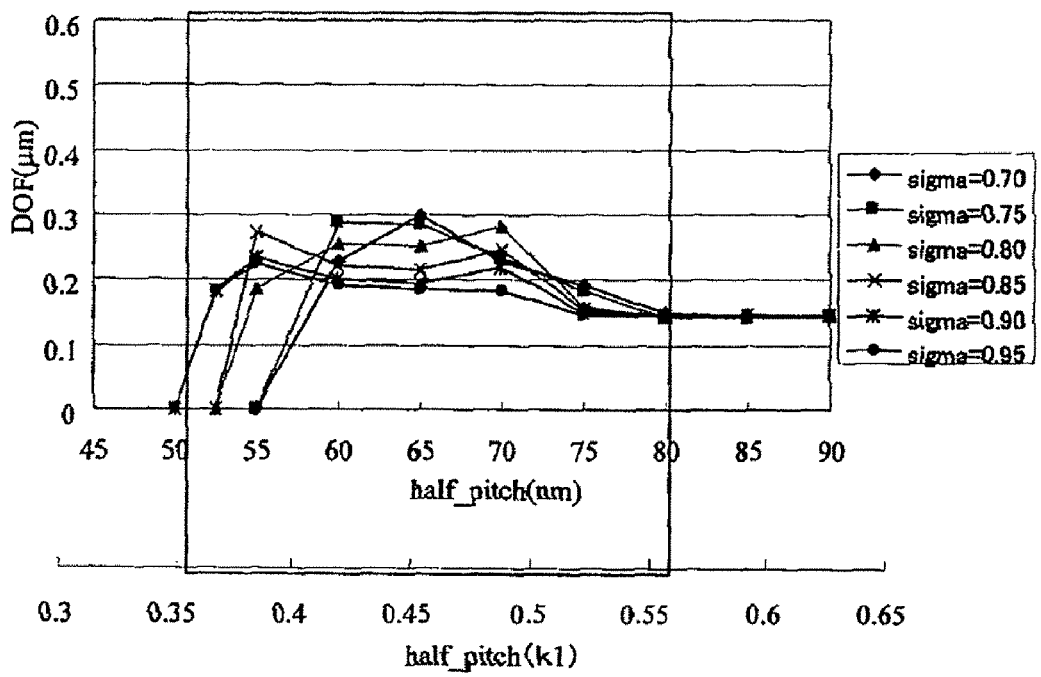
FIG. 19B is a graph showing a σ characteristic between the half pitch and the DOF when the effective source shown in FIG. 15A illuminates the right pattern shown in FIG. 5A according to the first embodiment of the present invention.

Next, the DOF variation is studied with the half pitch under the radial polarization in the quadrupole illumination. The effective source is a quadrupole illumination cut out of the ⅘ annulus, and σ is a parameter. The radial polarization is set to the polarization direction. FIG. 19A shows the DOF of the pattern $MP_{21}$, and FIG. 19B shows the DOF of the pattern $MP_{22}$. The horizontal axis denotes the half pitch of the contact hole (nm), and the vertical axis denotes the DOF (μm).

As described above, when the half pitches Px/2 and Py/2 of the patterns $MP_{21}$ and $MP_{22}$ are equal to each other, Equations 24 and 25 are satisfied from Equation 15 so that more than four diffracted lights are not incident upon the pupil, where the half pitch meets Px/2=Py/2=P/2. This condition provides the four-beam interference of the pattern $MP_{21}$ and the three-beam interference of the pattern $MP_{22}$, securing the DOF. FIGS. 19A and 19B enclose a half pitch range of $0.354<k_1<0.56$ (Equation 24) that satisfies this condition by a frame line. It is understood from FIGS. 19A and 19B that the DOF greater than 0.2 μm is obtained when both the patterns $MP_{21}$ and $MP_{22}$ satisfy this condition.

The four-beam interference becomes optimal when the centroid positions of the four sources meet the following equation:

$$a=1/(2k_1)/\sqrt{2}=1/(2.828k_1)=1/(2.828NA\cdot(P/2)/\lambda) \quad \text{[EQUATION 72]}$$

The three-beam interference is optimal when the centroid positions of the four sources meet the following equation.

$$a=1/(3.2k_1)=1/(3.2NA\cdot(P/2)/\lambda) \quad \text{[EQUATION 73]}$$

The optimal σ is estimated from σ=a+σr and, for example, σ32 0.86 with a half pitch of 65 (nm) and the four-beam interference. σ=0.76 with the three-beam interference. The maximum DOF is confirmed under this condition. In order to secure the DOF for both the patterns $MP_{21}$ and $MP_{22}$, σ may be set to 0.80 when the half pitch is 65 (nm). It is thus understood that the quadrupole illumination is the optimal illumination method to the pattern $MP_{22}$ as well as the pattern $MP_{21}$.

As apparent from this embodiment, the three-beam interference provides a larger DOF for a fine pattern. Therefore, in order for a finer pattern to resolve, for example, it is conceivable to adjust a pattern pitch that provides an optimal four-beam interference condition or that makes an optimal three-beam interference condition close to the optimal four-beam interference condition.

Second Embodiment

Figure 17A:
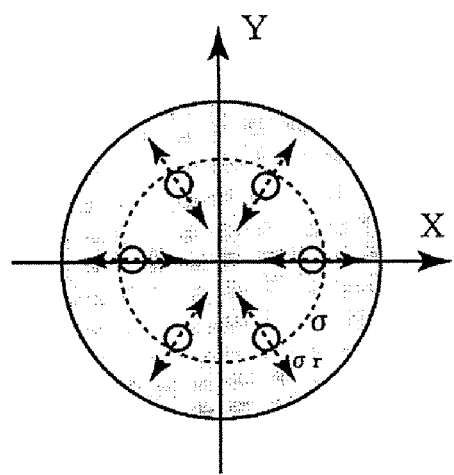
FIG. 17A is a schematic plane view showing one illustrative radial polarization.
Figure 17B:
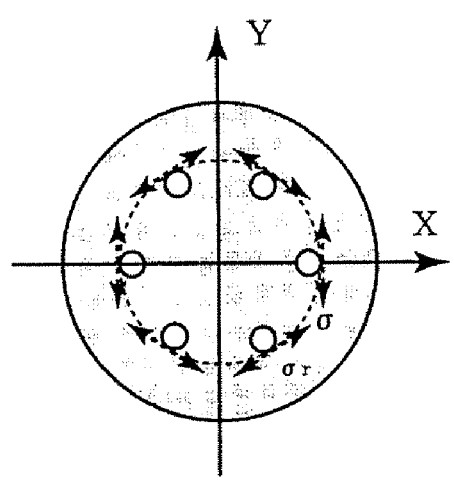
FIG. 17B is a schematic plane view showing one illustrative tangential polarization.

A hexapole illumination is used to image a hybrid pattern of the patterns $MP_{21}$ and $MP_{22}$ of Px=Py=P or having the same pitch in the longitudinal direction and the lateral direction. The mask is an attenuated-PSM. The contrast and DOF are shown when the immersion exposure apparatus similar to the first embodiment is used to image the pattern while changing the contact hole pitch. First, the way of variation of the contrast depending upon the polarization direction is studied. The effective source is the hexapole illumination shown in FIGS. 17A and 17B with $\sigma=0.70$ and $\sigma r=0.10$. The radial polarization, the tangential polarization, and an unpolarization are compared.

Figure 20A:
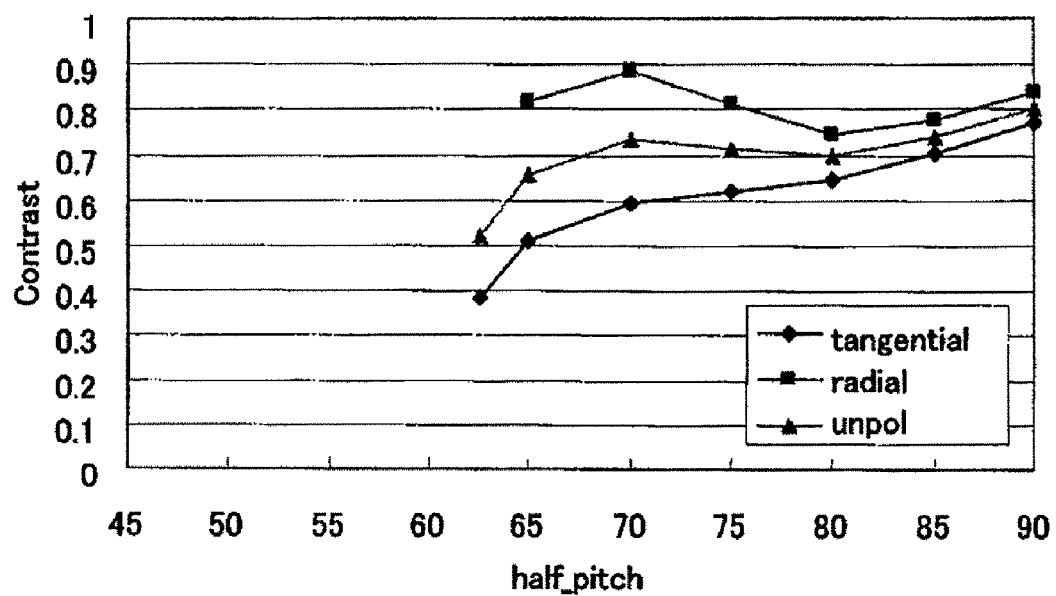
FIG. 20A is a graph showing a polarization characteristic between the half pitch and the contrast when the effective source shown in FIG. 13A hexapole illumination illuminates the left pattern shown in FIG. 5A according to a second embodiment of the present invention.
Figure 20B:
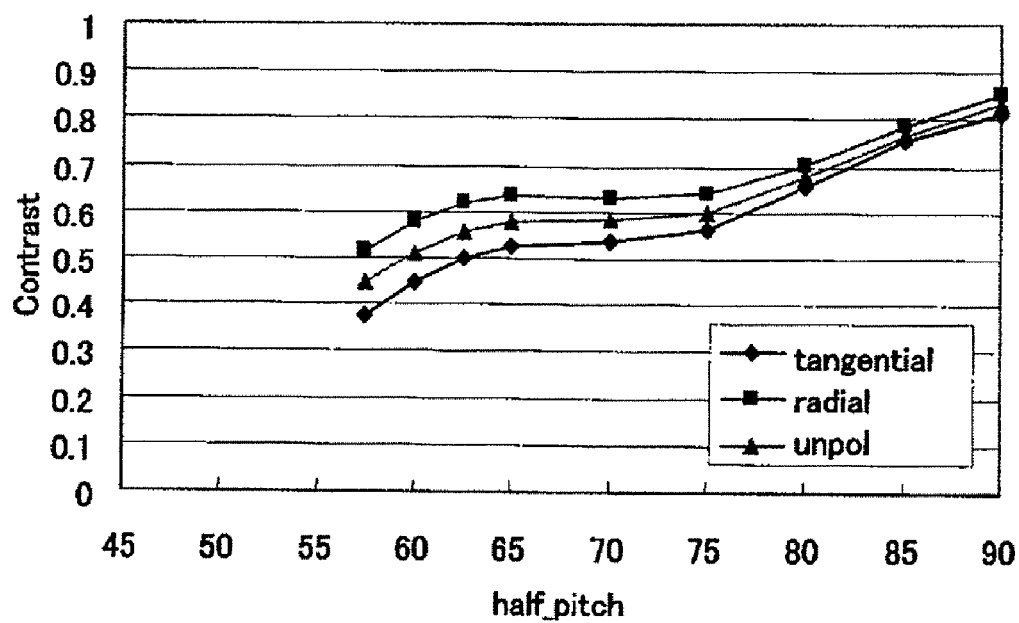
FIG. 20B is a graph showing a polarization characteristic between the half pitch and the contrast when hexapole illumination illuminates the right pattern shown in FIG. 5A according to the second embodiment of the present invention.

FIG. 20A shows a contrast on the X section of the pattern $MP_{21}$. FIG. 20B shows a contrast on the X section of the pattern $MP_{22}$. The horizontal axis denotes the half pitch of the contact hole (nm), and the vertical axis denotes the contrast peak. It is understood from FIGS. 20A and 20B that the radial polarization provides a higher contrast to both the patterns $MP_{21}$ and $MP_{22}$. Under this illumination condition, the contrast on the X section of the pattern $MP_{21}$ is uniform in every direction, but does not accord with that on the Y section of the pattern $MP_{21}$. Axial sources on the X section of the pattern $XP_{21}$, which satisfy the half pitch of 76 (nm) or greater or $k_1>0.534$ provide the four-beam interference. Therefore, the radial polarization provides a better contrast in the Y direction, and lowers the contrast on the X section. However, on the X section of the pattern $MP_{21}$, the contrast is likely to lower but the radial polarization is superior on the X section.

Figure 21A:
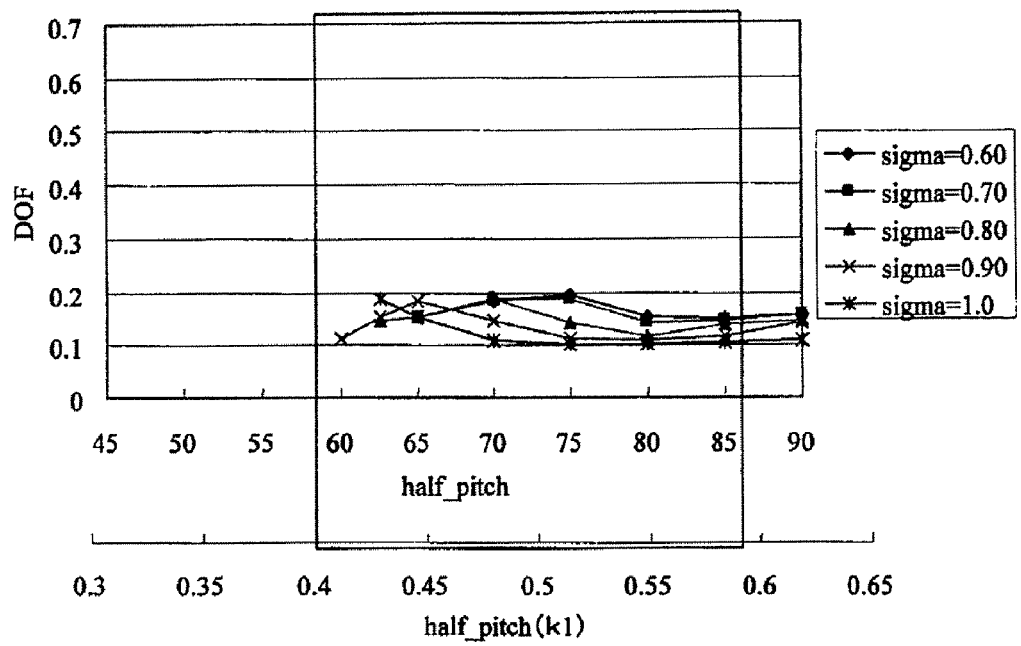
FIG. 21A is a graph showing a σ characteristic between the half pitch and the DOF when the effective source shown in FIG. 16A illuminates the left pattern shown in FIG. 5A according to the second embodiment of the present invention.
Figure 21B:
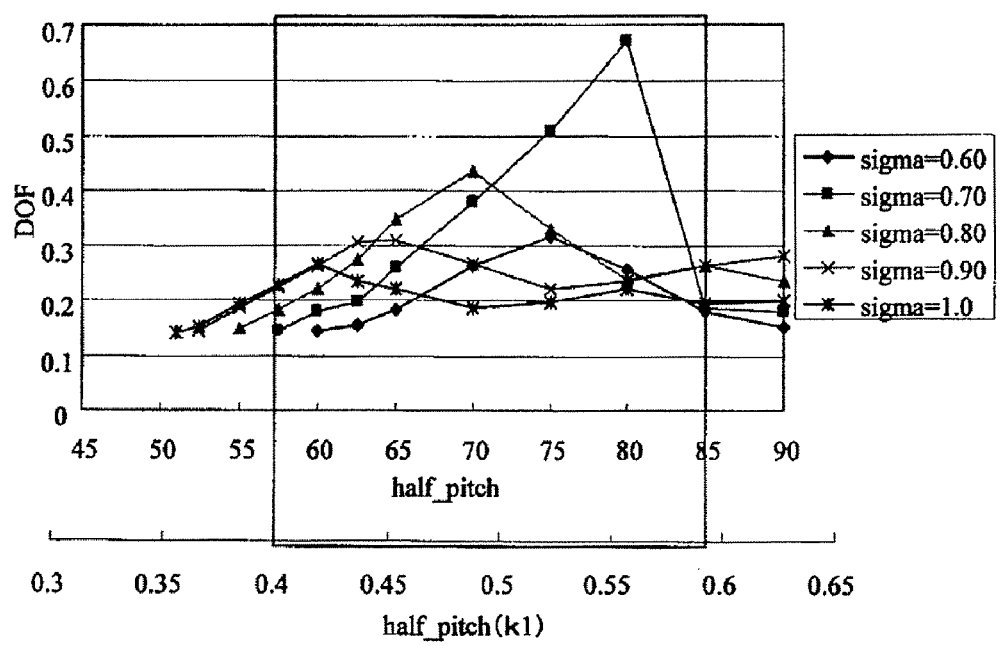
FIG. 21B is a graph showing a σ characteristic between the half pitch and the DOF when the effective source shown in FIG. 16A illuminates the right pattern shown in FIG. 5A according to the second embodiment of the present invention.

Next, the CD DOF variation is studied with the half pitch under the radial polarization in the quadrupole illumination. The effective source has σr=0.10, and assigns σ to a parameter. The radial polarization is set to the polarization direction. FIG. 21A shows the DOF of the pattern $MP_{21}$, and FIG. 21B shows the DOF of the pattern $MP_{22}$. The horizontal axis denotes the half pitch of the contact hole (nm), and the vertical axis denotes the DOF (μm). As described above, when the half pitches Px/2 and Py/2 of the patterns $MP_{21}$, and $MP_{22}$ are equal to each other, Equations 42 and 43 are satisfied from Equation 15 so that more than four diffracted lights are not incident upon the pupil, where the half pitch meets Px/2=Py/2=P/2.

This condition provides the four-beam interference of the pattern $MP_{21}$, and the three-beam interference of the pattern $MP_{22}$, securing the CD DOF. FIGS. 21A and 21B enclose a half pitch range of $0.40<k_1<0.59$ (Equation 42) that satisfies this condition by a frame line. From FIGS. 21A and 21B that the DOF greater than 0.2 μm is obtained when both the patterns $MP_{21}$, and $MP_{22}$ satisfy this condition, but it is confirmed that the depth of the pattern $MP_{21}$ is smaller than that of the pattern $MP_{22}$. The hexapole illumination is an optimal illumination to the pattern $MP_{22}$, but is unlikely to obtain the DOFon the pattern since the axial effective source deteriorates the imaging characteristic for the pattern $MP_{21}$.

Third Embodiment

A description will now be given of the illumination condition of the hybrid pattern of the matrix pattern $MP_{21}$ shown in FIG. 24 and the checker pattern $MP_{22}$ which hybrid pattern is made by inserting an auxiliary pattern into the pattern shown in FIG. 23. The mask is an attenuated-PSM, and a size of the contact hole is 60 nm. Px=Py=120 nm, and the auxiliary pattern has a width of 60×0.8=48 (nm). An immersion exposure apparatus having an ArF (193 nm) and an NA of 1.35 is used for exposure with the above exposure condition. When half pitches Px/2=Py/2=60 nm in the X and Y directions are $k_1$-converted, $k_1$=0.42 or Pxo/2=Pyo/2=0.42 and Pxo/Pyo=d=1 are satisfied.

As described above, the optimal exposure condition for the illumination condition of the patterns shown in FIGS. 24A and 24B is derived from Equation 64 as follows:

$$\alpha_1 = \tan^{-1}(d) = 45 (deg) \quad [\text{EQUATION 74}]$$

$$a_1 = 1/(1.424 \cdot 0.42 \cdot 2) = 0.84 \quad [\text{EQUATION 75}]$$

The optimal exposure condition of the pattern shown in FIG. 24C is as follows from Equations 65 and 67:

$$\alpha_2 = 2\tan^{-1}(d/1.5) = 67 (deg) \quad [\text{EQUATION 76}]$$

$$a_2 = 1/(1.385 \cdot 0.42 \cdot 2) = 0.86 \quad [\text{EQUATION 77}]$$

Since $a_1$, and $a_2$, and $\alpha_1$ and $\alpha_2$ are close to each other, the octapole illumination shown in FIG. 2, or the quadrupole illumination shown in FIG. 3 can be set to the optimal illumination condition. If octapole illumination, eight sources having local σ of 0.2 or smaller are arranged at angle α1, π−α1, π+α1, and 2π−α1 at radius a1, and at angle α2, π−α2, π+α2, and 2π−α2 at radius a2. If quadrupole illumination, an arc extends in the direction covering $\alpha_1$, and $\alpha_2$. In other words, an arc having a center angle of ±15° around 56° in a range of $0.755 \leq \sigma \leq 0.945$ with a center of the annulus of 0.85 is cut out at four points so as to be symmetrical in the X and Y axes. This embodiment uses a radial polarization.

Figure 25:
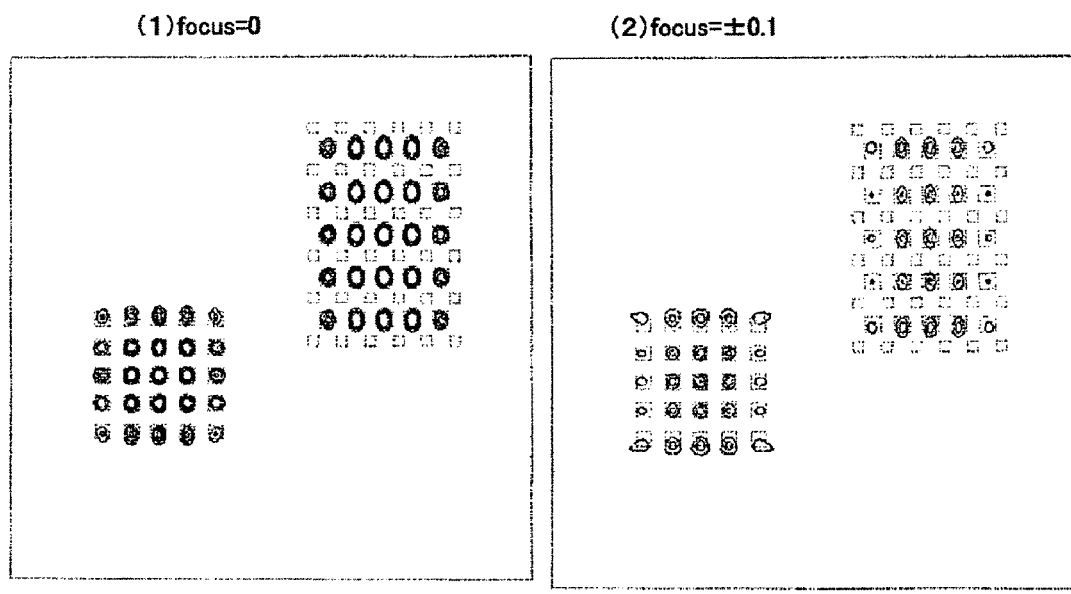
FIG. 25 is a two-dimensional light intensity distribution when the effective source shown in FIG. 3 images the contact hole patterns shown in FIGS. 24A and 24C, wherein FIG. 25(1) shows a two-dimensional image at the best focus, and FIG. 25(2) shows a two-dimensional image at the defocus of ±0.1 μm.
Figure 26:
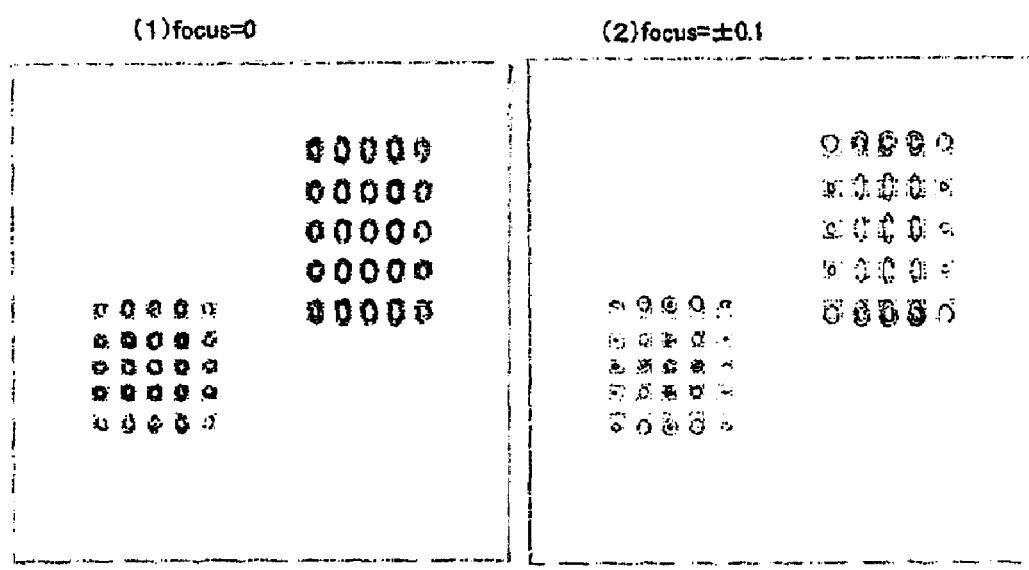
FIG. 26 is a two-dimensional light intensity distribution when the effective source shown in FIG. 3 images the contact hole patterns shown in FIGS. 23A and 23C, wherein FIG. 26(1) shows a two-dimensional image at the best focus, and FIG. 26(2) shows a two-dimensional image at the defocus of ±0.1 μm.

A result of the exposure under these conditions will be indicated. FIG. 25 is a two-dimensional intensity distribution of image at the patterns shown in FIGS. 24A and 24C. FIG. 26 is a two-dimensional intensity distribution of image at the patterns shown in FIGS. 23A and 23C. Contours of the intensity with a predetermined level and ±20% of the intensity are shown. FIGS. 25(1) and 26(1) show results at the best focus, and FIGS. 25(2) and 26(2) show results at defocus with ±0.1 μm. Now FIG. 25 will be compared with FIG. 26: At the best focus, the auxiliary pattern shown in FIG. 25(1) provides a better contrast in the Y direction, and restrains the extension in the Y direction. At the defocus, the auxiliary pattern shown in FIG. 25(2) provides a much better contrast. Without the auxiliary pattern, the pitch in the Y direction is a forbidden pitch, which does not provide a sufficient DOF. When the auxiliary pattern is inserted, a DOF similar to the left dense pattern is acquired.

Figure 29:
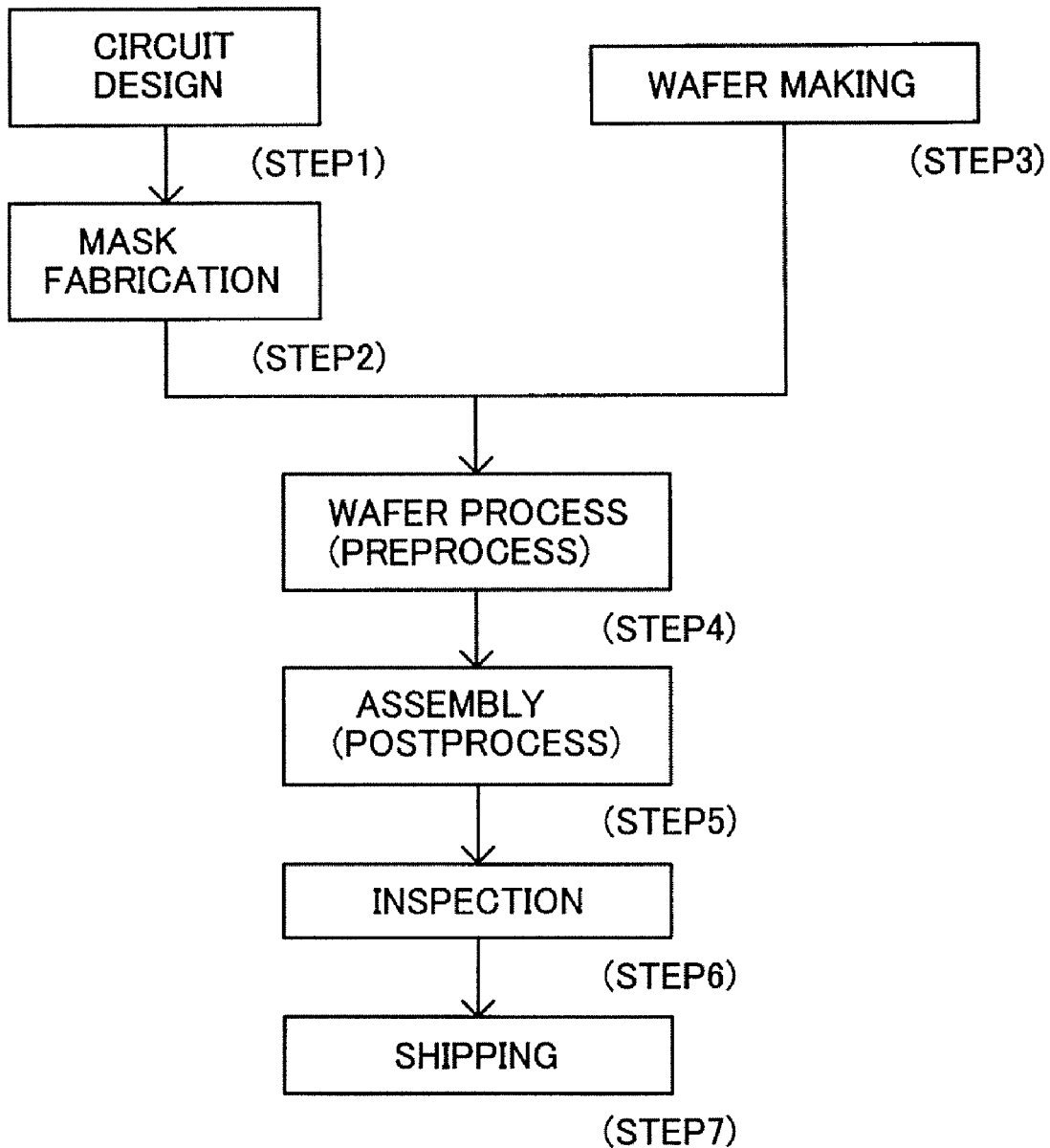
FIG. 29 is a flowchart for explaining manufacture of devices (such as semiconductor chips such as ICs and LCDs, CCDs, and the like).
Figure 30:
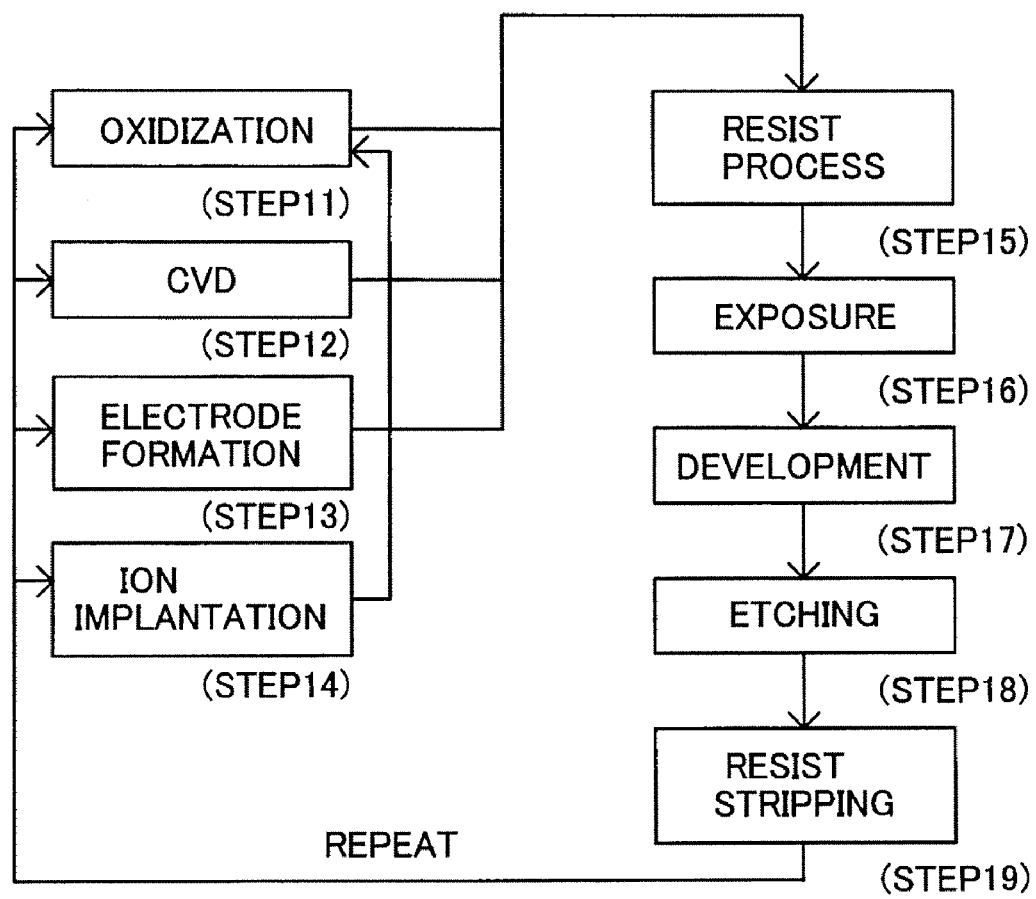
FIG. 30 is a detailed flowchart of a wafer process as Step 4 shown in FIG. 29.

Referring now to FIGS. 29 and 30, a description will now be given of an embodiment of a device manufacturing method using the exposure apparatus 100. FIG. 29 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 30 is a detailed flowchart of the wafer process in Step 4 shown in FIG. 29. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a mask pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer 170. Use of the manufacturing method of this embodiment can manufacture highly precise devices by stably resolving the hybrid pattern $MP_{20}$, which have been difficult to manufacture.

From the above result, an optimization of the quadrupole illumination to the hybrid pattern provides imaging of the contact hole pattern through the three-beam or four-beam interference, and secures the CD DOF greater than 0.2 μm. Therefore, the exposure method of the above embodiment is a practical and effective method to the fine processing of the contact holes.

Further, the present invention is not limited to these preferred embodiments, and various variations and modifications may be made without departing from the scope of the present invention.

This application claims a benefit of priority based on Japanese Patent Application No. 2005-309799, filed on Oct. 25, 2005, which is hereby incorporated by reference herein in its entirety as if fully set forth herein.

What is claimed is:

1. An exposure method comprising the step of illuminating a mask having a contact hole pattern that includes a hybrid pattern using an illumination light that forms an effective source that has plural sources, and projecting an image of the mask onto a plate through a projection optics, the hybrid pattern including a matrix pattern in which plural contact holes are arranged in a matrix shape, and a checker pattern in which plural contact holes are arranged in a checker shape, wherein the matrix pattern has $n_i$ pitches, in which $Px_i$ is an i-th pitch between contact holes in a array direction, and $Py_i$ is an i-th pitch between contact holes in a column direction, the checker pattern has $n_j$ pitches, in which $Px_j$ is a j-th pitch between contact holes in a array direction, and $Py_j$ is a j-th pitch between contact holes in a column direction, NA is a numerical aperture of the projection optics, and $\lambda$ is a wavelength of the illumination light, wherein the following equations are satisfied:

$Pxo_i/2=(Px_i/2)NA/\lambda$, $1 \leq i \leq n_i$, $Pyo_i/2=(Py_i/2)NA/\lambda$, $1 \leq i \leq n_i$, $Pxo_j/2=(Px_j/2)NA/\lambda$, $1 \leq j \leq n_j$, $Pyo_j/2=(Py_j/2)NA/\lambda$, $1 \leq j \leq n_j$, $\alpha_i=\tan^{-1}(Pxo_i/Pyo_i)$, $1 \leq i \leq n_i$, $\alpha_j=2\tan^{-1}(Pxo_j/(2Pyo_j))$, $1 \leq j \leq n_j$, $a_i=1/(4(Pyo_i/2))/\sin(\alpha_i)$, $1 \leq i \leq n_i$, $a_j=1/(4(Pyo_j/2))/\sin(\alpha_j)$, $1 \leq j \leq n_j$, and wherein a distance between each centroid of the plural sources in the effective source and a center of the pupil in the projection optics is the same as $a_i$, the centroid of the plural sources being located at angles $\alpha_i$, $\pi-\alpha_i$, $\pi+\alpha_i$, and $2\pi-\alpha_i$ where $\alpha_i$ is an angle from the array direction viewed from the center of the pupil, a distance between each centroid of the plural sources in the effective source and a center of the pupil in the projection optics being the same as $a_j$, the centroid of the plural sources being located at angles $\alpha_j$, $\pi-\alpha_j$, $\pi+\alpha_j$, and $2\pi-\alpha_j$ where $\alpha_j$ is an angle from the column direction viewed from the center of the pupil, and three or four diffracted lights from the contact hole pattern interfering with each other.

2. An exposure method according to claim 1, wherein the mask is an attenuated phase shift mask, and said illuminating step illuminates the mask using a radially polarized light.

3. An exposure method according to claim 1, wherein the mask is a binary mask, and said illuminating step illuminates the mask using an unpolarized light.

4. An exposure method according to claim 1, wherein the following equations are satisfied:

$1/(4(Pyo_i/2))/\sin(\alpha_i)<1$, $1 \leq i \leq n_i$, $1/(2(Pyo_i/2)/\sin(\alpha_i+\beta_i)/\cos(\beta_i)>1$, where $\beta_i=\tan^{-1}(2Pxo_i/Pyo_i)-\alpha_i$, $1 \leq i \leq n_i$, and $1/(2(Pyo_j/2))/(\sin(\tan^{-1}(1/Pyo_j/e_j)))>1$, where $e_j=1/(2(Pxo_j/2))-a_i\cos(\alpha_i)$, $1 \leq j \leq n_j$.

5. An exposure method according to claim 1, wherein the following equations are satisfied:

$1/(4(Pyo_j/2))/\sin(\alpha_j)<1$, $1 \leq j \leq n_j$, $1/(2(Pyo_j/2)/(\sin(\tan^{-1}(1/(2(Pyo_j/2))/a_j))>1$, $1 \leq j \leq n_j$, $1/(4(Pyo_j/2))/(\sin(\tan^{-1}(1/(4(Pyo_j/2)/c_i)))>1$, where $c_i=1/(2(Pxo_j/2))-a_j\cos(\alpha_j)$, $1 \leq i \leq n_i$.

6. An exposure method according to claim 1, wherein the matrix pattern has a pitch Px in the array direction, and a pitch Py in the column direction, the checker pattern has a pitch Pxb in the array direction, and a pitch Pyb in the column direction, and the following equations are satisfied:

$Px/Py=Pxb/Pyb=d$, $C=(-1+\sqrt{(1+d^2)})/d$, and $Pyb/Py=Pxb/Px=c(4+d^2)/2d/(1+c^2)$.

7. An exposure method according to claim 1, wherein the contact hole pattern includes a target pattern and an auxiliary pattern smaller than the target pattern, and wherein said exposure method enables the target pattern to resolve, and restrains the auxiliary pattern from resolving.

8. An exposure method comprising the step of illuminating a mask having a contact hole pattern that includes a hybrid pattern using an illumination light that forms an effective source that has four poles, and projecting an image of the mask onto a plate through a projection optics, the hybrid pattern including a matrix pattern in which plural contact holes are arranged in a matrix shape, and a checker pattern in which plural contact holes are arranged in a checker shape, wherein a distance between each centroid of the four poles in the effective source and a center of the pupil in the projection optics is the same as a, the centroids of the four poles being located at angles $\alpha$, $\pi-\alpha$, $\pi+\alpha$, and $2\pi-\alpha$ where $\alpha$ is an angle from a array direction viewed from the center of the pupil, the matrix pattern having a pitch $Px_1$ between contact holes in a array direction, and a pitch $Py_1$ between the contact holes in a column direction, the checker pattern having a pitch $Px_2$ between contact holes in a array direction, and a pitch $Py_2$ between the contact holes in a column direction, NA being a numerical aperture of the projection optics, and $\lambda$ being a wavelength of the illumination light, and wherein the following equations are satisfied:

$Pxo_1/2=(Px_1/2)NA/\lambda$, $Pyo_1/2=(Py_1/2)NA/\lambda$, $Pxo_2/2=(Px_2/2)NA/\lambda$, $Pyo_2/2=(Py_2/2)NA/\lambda$, $\alpha_1=\tan^{-1}(Pxo_1/Pyo_1)$, $\alpha_2=2\tan^{-1}(Pxo_2/(2Pyo_2))$, $a_1=1/(4(Pyo_1/2))/\sin(\alpha_1)$, $a_2=1/(4(Pyo_2/2))/\sin(\alpha_2)$, $\alpha$ contains $\alpha_1$ and $\alpha_2$, a contains $a_1$ and $a_2$, and three or four diffracted lights from the contact hole pattern interfering with each other.

9. An exposure method according to claim 8, wherein the following equations are satisfied:

$1/(4(Pyo_1/2))/\sin(\alpha_1)<1$, $1/(2(Pyo_1/2)/\sin(\alpha_1+\beta_1)/\cos(\beta_1)>1$, where $\beta_1=\tan^{-1}(2Pxo_1/Pyo_1)-\alpha_1$, and $1/(2(Pyo_2/2))/(\sin(\tan^{-1}(1/Pyo_2/e_2)))>1$, where $e_2=1/(2(Pxo_2/2))-a_1\cos(\alpha_1)$.

10. An exposure method according to claim 8, wherein the following equations are satisfied:

$$1/(4(Pyo_2/2))/\sin(\alpha_2)<1,$$

$$1/(2(Pyo_2/2))/(\sin(\tan^{-1}(1/(2(Pyo_2/2))/a_2)>1, \text{ and}$$

$$1/(4(Pyo_1/2))/(\sin(\tan^{-1}(1/(4(Pyo_1/2)/c_1)))>1, \text{ where}$$
$$c_1=1/(2(Pxo_1/2))-a_2\cos(\alpha_2).$$

11. An exposure method comprising the step of illuminating a mask having a contact hole pattern that includes a hybrid pattern using an illumination light that forms an effective source that has eight poles, and projecting an image of the mask onto a plate through a projection optics, the hybrid pattern including a matrix pattern in which plural contact holes are arranged in a matrix shape, and a checker pattern in which plural contact holes are arranged in a checker shape, wherein a distance between each centroid of the eight poles in the effective source and a center of the pupil in the projection optics is the same as $a_1$, the centroids of the plural poles being located at angles $\alpha_1$, $\pi-\alpha_1$, $\pi+\alpha_1$, and $2\pi-\alpha_1$ where $\alpha_1$ is an angle from a array direction viewed from the center of the pupil, and is the same as $a_2$, the centroids of the eight poles being located at angles $\alpha_2$, $\pi-\alpha_2$, $\pi+\alpha_2$, and $2\pi-\alpha_2$ where $\alpha_2$ is an angle from a column direction viewed from the center of the pupil, the matrix pattern having a pitch $Px_1$ between contact holes in a array direction, and a pitch $Py_1$ between the contact holes in a column direction, the checker pattern having a pitch $Px_2$ between contact holes in a array direction, and a pitch $Py_2$ is between the contact holes in a column direction, NA being a numerical aperture of the projection optics, and $\lambda$ being a wavelength of the illumination light, wherein the following equations are satisfied:

$$Pxo_1/2=(Px_1/2)NA/\lambda,$$

$$Pyo_1/2=(Py_1/2)NA/\lambda,$$

$$Pxo_2/2=(Px_2/2)NA/\lambda,$$

$$Pyo_2/2=(Py_2/2)NA/\lambda,$$

$$\alpha_1=\tan^{-1}(Pxo_1/Pyo_1),$$

$$\alpha_2=2\tan^{-1}(Pxo_2/(2Pyo_2)),$$

$$a_1=1/(4(Pyo_1/2))/\sin(\alpha_1),$$

$$a_2=1/(4(Pyo_2/2))/\sin(\alpha_2), \text{ and}$$

three or four diffracted lights from the contact hole pattern interfering with each other.

* * * * *